US012635221B2

(12) United States Patent
Kaufmann et al.

(10) Patent No.: US 12,635,221 B2
(45) Date of Patent: May 19, 2026

(54) HIGH-VOLTAGE DEPLETION-MODE CURRENT SOURCE, TRANSISTOR, AND FABRICATION METHODS

(71) Applicant: TEXAS INSTRUMENTS INCORPORATED, Dallas, TX (US)

(72) Inventors: Maik Peter Kaufmann, Freising (DE); Michael Lueders, Freising (DE); Chang Soo Suh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 654 days.

(21) Appl. No.: 17/548,426

(22) Filed: Dec. 10, 2021

(65) Prior Publication Data

US 2022/0399328 A1    Dec. 15, 2022

Related U.S. Application Data

(60) Provisional application No. 63/210,801, filed on Jun. 15, 2021.

(51) Int. Cl.
H10D 84/01        (2025.01)
H10D 1/47          (2025.01)
              (Continued)

(52) U.S. Cl.
CPC .............. H10D 84/01 (2025.01); H10D 1/47 (2025.01); H10D 1/68 (2025.01); H10D 30/015 (2025.01);
              (Continued)

(58) Field of Classification Search
CPC ............. H01L 27/0605; H01L 27/0629; H01L 21/8252; H01L 28/20; H01L 28/40;
              (Continued)

(56) References Cited

U.S. PATENT DOCUMENTS 5,459,652  A      10/1995  Faulk
9,543,402  B1 *   1/2017   Kudymov .............. H10D 62/85
              (Continued)

FOREIGN PATENT DOCUMENTS

CN        111987151 A  * 11/2020  .............. H10D 8/60
EP        3131122 A1     2/2017

OTHER PUBLICATIONS

Zhu Mingda et al: "1.9-kV AlGaN/GaN Lateral Schottky Barrier Diodes on Silicon", IEEE Electron Device Letters, IEEE, USA, vol. 36, No. 4, Apr. 2015, pp. 375-377, XP011576492, ISSN: 0741-3106, DOI: 10.1109/LED.2015.2404309.

*Primary Examiner* — Fernando L Toledo
*Assistant Examiner* — Marshall Mu-Nuo Hatfield
(74) *Attorney, Agent, or Firm* — Yudong Kim; Frank D. Cimino

(57)        ABSTRACT

A depletion-mode current source having a saturation current of sufficient accuracy for use as a pre-charge circuit in a start-up circuit of an AC-to-DC power converter is fabricated using an enhancement-mode-only process. The depletion-mode current source can be fabricated on the same integrated circuit (IC) as a gallium nitride field-effect transistor (FET) and resistive and capacitive components used in the start-up circuit, without affecting the enhancement-mode-only fabrication process by requiring additional masks or materials, as would be required to fabricate a depletion-mode FET on the same IC as an enhancement-mode FET. The current source includes a resistive patterned two-dimensional electron gas (2DEG) or two-dimensional hole gas (2DHG) channel coupled between two terminals and one or more metal field plates extending from one of the terminals and overlying the patterned area of the channel, the field plates being separated from the channel and from each other by dielectric layers.

18 Claims, 26 Drawing Sheets

(51) Int. Cl.

| | |
|---|---|
| *H10D 1/68* | (2025.01) |
| *H10D 30/01* | (2025.01) |
| *H10D 30/47* | (2025.01) |
| *H10D 62/824* | (2025.01) |
| *H10D 62/85* | (2025.01) |
| *H10D 64/62* | (2025.01) |
| *H10D 84/05* | (2025.01) |
| *H10D 84/80* | (2025.01) |

(52) U.S. Cl.
 CPC ......... *H10D 30/475* (2025.01); *H10D 62/824* (2025.01); *H10D 62/85* (2025.01); *H10D 62/8503* (2025.01); *H10D 64/62* (2025.01); *H10D 84/05* (2025.01); *H10D 84/811* (2025.01)

(58) Field of Classification Search
 CPC . H01L 29/2003; H01L 29/205; H01L 29/452; H01L 29/66462; H01L 29/7786
 See application file for complete search history.

(56) References Cited

U.S. PATENT DOCUMENTS

| | | | |
|---|---|---|---|
| 2014/0091311 A1* | 4/2014 | Jeon | H10D 1/66 |
| | | | 257/76 |
| 2015/0028384 A1* | 1/2015 | Cao | H10D 62/8503 |
| | | | 257/140 |
| 2017/0018617 A1* | 1/2017 | Xia | H10D 30/6738 |
| 2017/0301781 A1* | 10/2017 | Boles | H10D 30/015 |
| 2018/0158909 A1* | 6/2018 | Mishra | H10D 30/4738 |
| 2018/0261545 A1* | 9/2018 | Sundaram | H01L 24/11 |
| 2019/0267456 A1* | 8/2019 | Chen | H10D 30/015 |
| 2019/0348410 A1 | 11/2019 | Roig-Guitart et al. | |
| 2020/0044032 A1* | 2/2020 | Haeberlen | H10D 30/015 |
| 2020/0098745 A1* | 3/2020 | Roig-Guitart | H10D 62/114 |
| 2020/0135909 A1* | 4/2020 | Tanaka | H10D 30/475 |
| 2020/0251586 A1 | 8/2020 | Otake | |
| 2020/0259010 A1* | 8/2020 | Wu | H10D 62/85 |
| 2020/0274530 A1 | 8/2020 | Lueders et al. | |
| 2020/0357909 A1* | 11/2020 | Udrea | H10D 30/47 |
| 2021/0265477 A1* | 8/2021 | Lu | H10D 64/602 |
| 2021/0408273 A1* | 12/2021 | Wu | H01L 24/06 |

* cited by examiner

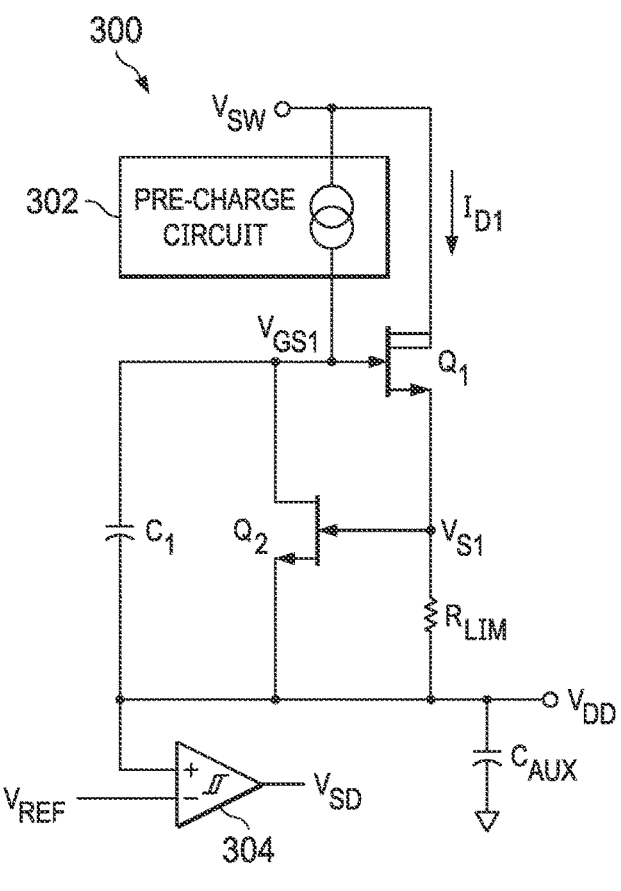
FIG. 3A
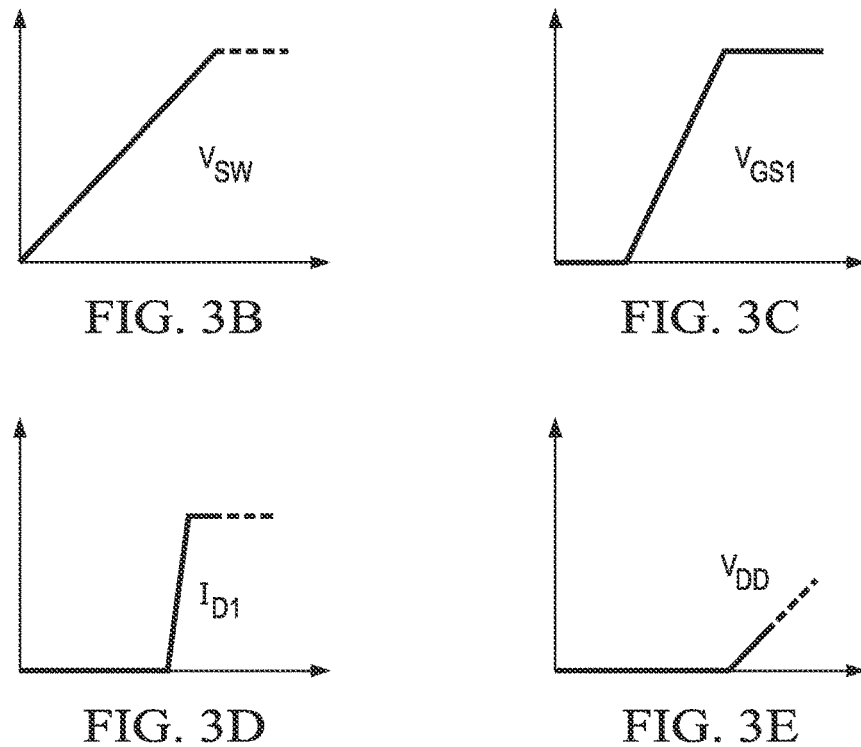
FIG. 3B          FIG. 3C
FIG. 3D          FIG. 3E

I-V CHARACTERISTIC FOR DEPLETION-MODE CURRENT
SOURCES WITH 2DEG CONFIGURED WITH A 1 MΩ RESISTANCE

I-V CHARACTERISTIC FOR DEPLETION-MODE CURRENT
SOURCES HAVING A LOWER BOTTOM FIELD PLATE AND WITH
2DEGS CONFIGURED WITH 500 kΩ OR 1 MΩ RESISTANCES

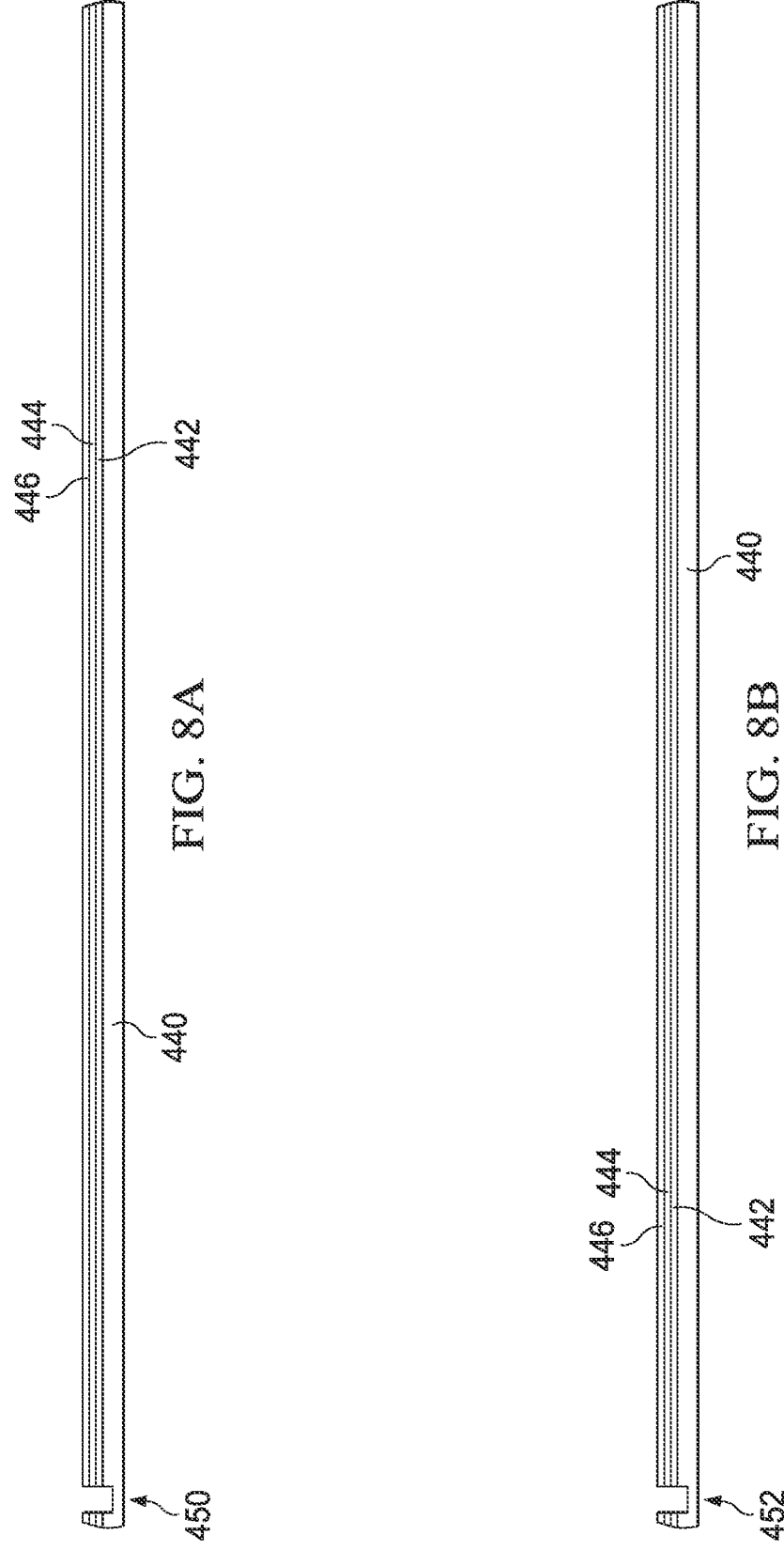

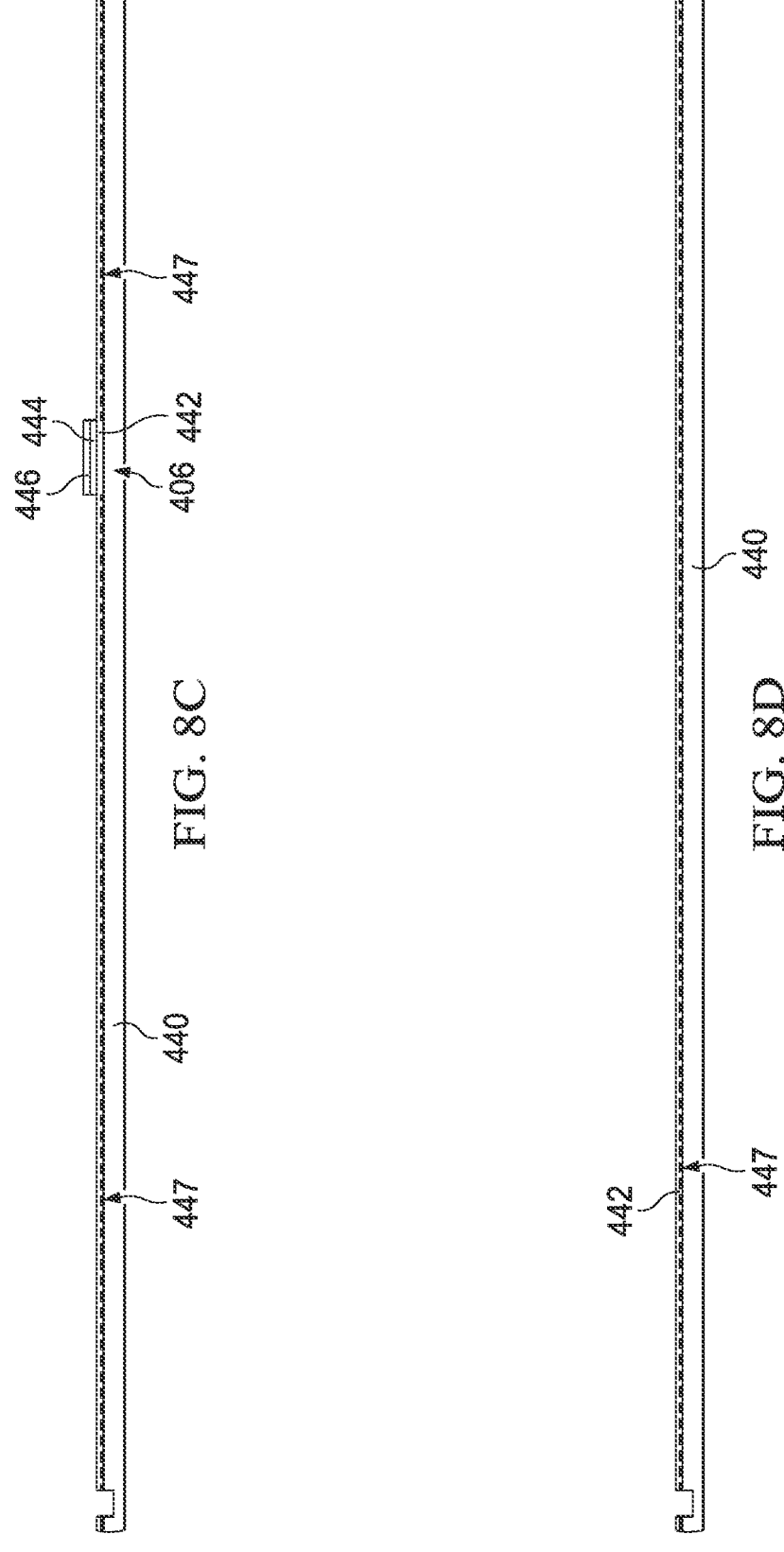

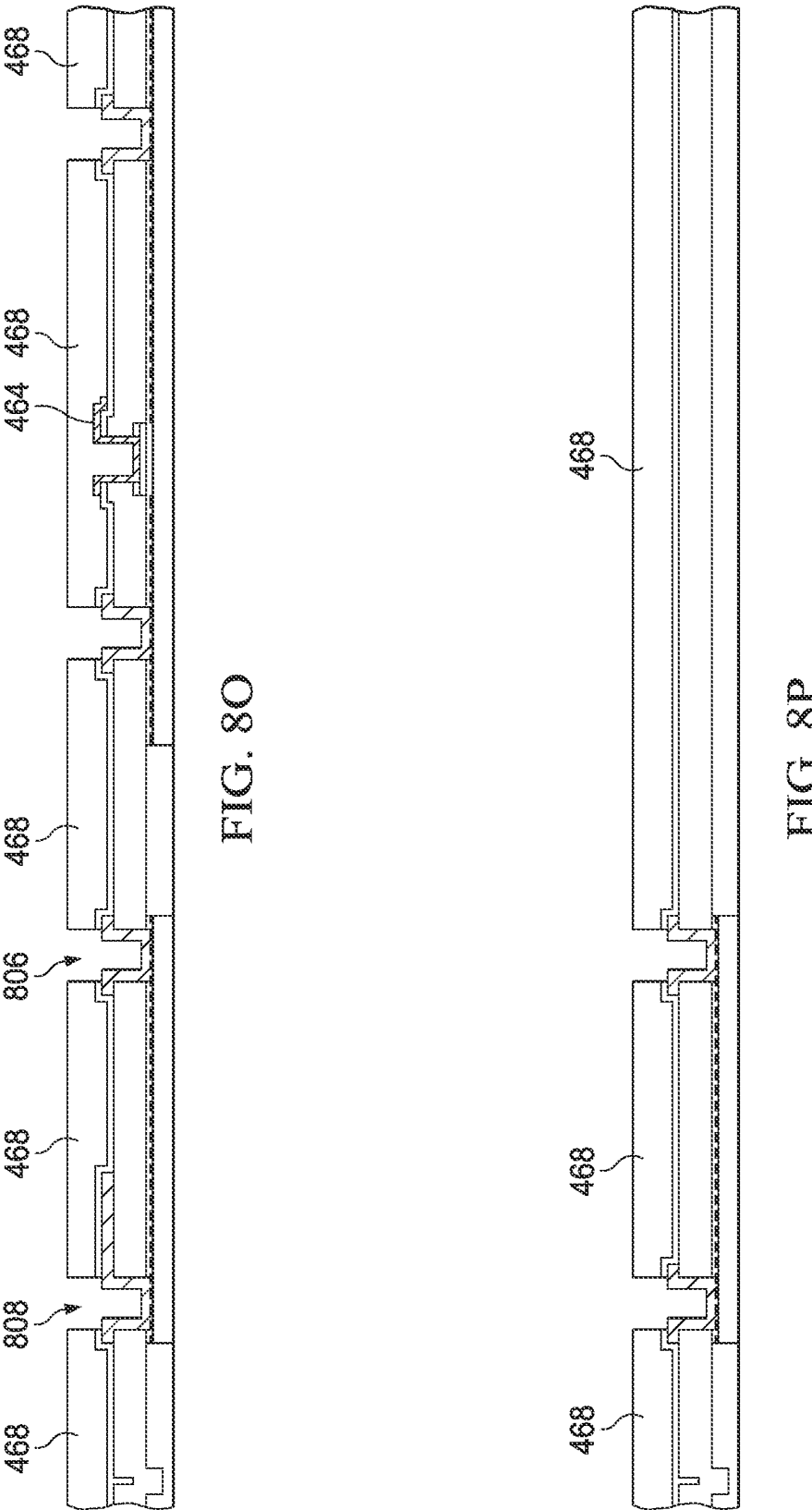

900

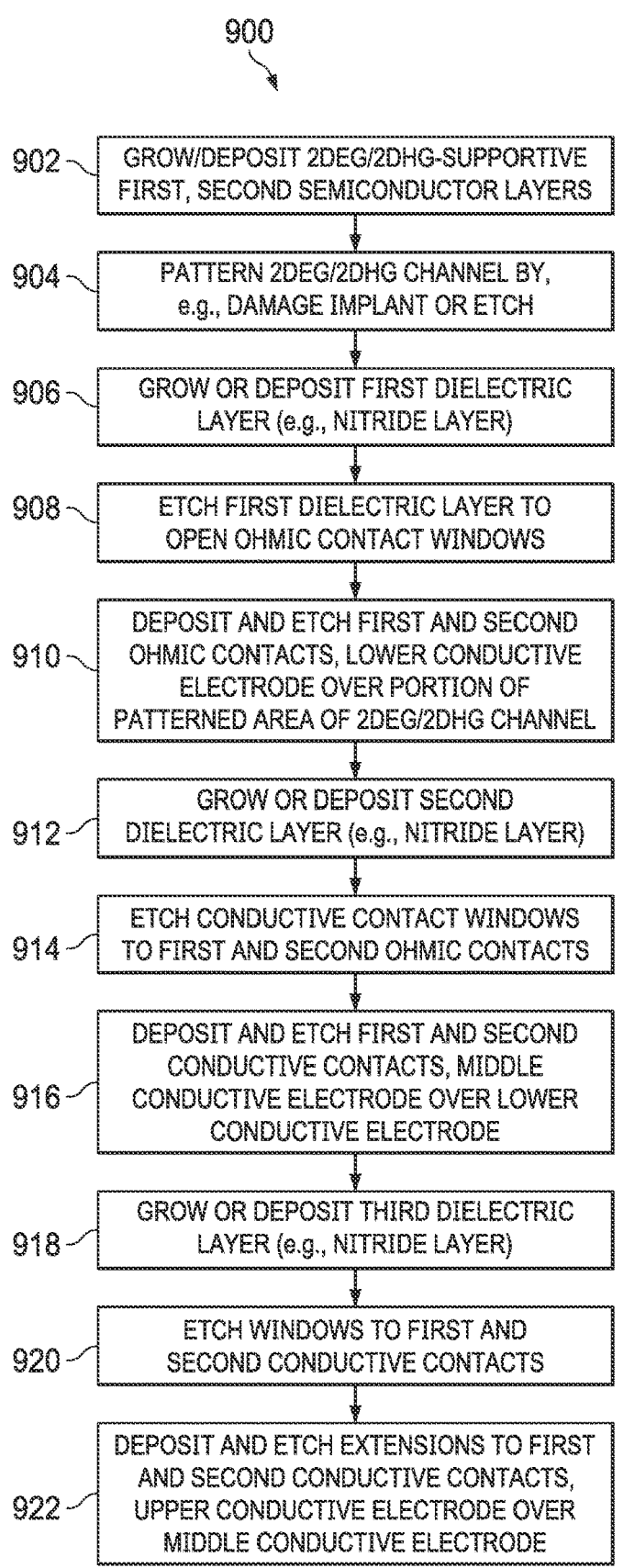

902 — GROW/DEPOSIT 2DEG/2DHG-SUPPORTIVE FIRST, SECOND SEMICONDUCTOR LAYERS

904 — PATTERN 2DEG/2DHG CHANNEL BY, e.g., DAMAGE IMPLANT OR ETCH

906 — GROW OR DEPOSIT FIRST DIELECTRIC LAYER (e.g., NITRIDE LAYER)

908 — ETCH FIRST DIELECTRIC LAYER TO OPEN OHMIC CONTACT WINDOWS

910 — DEPOSIT AND ETCH FIRST AND SECOND OHMIC CONTACTS, LOWER CONDUCTIVE ELECTRODE OVER PORTION OF PATTERNED AREA OF 2DEG/2DHG CHANNEL

912 — GROW OR DEPOSIT SECOND DIELECTRIC LAYER (e.g., NITRIDE LAYER)

914 — ETCH CONDUCTIVE CONTACT WINDOWS TO FIRST AND SECOND OHMIC CONTACTS

916 — DEPOSIT AND ETCH FIRST AND SECOND CONDUCTIVE CONTACTS, MIDDLE CONDUCTIVE ELECTRODE OVER LOWER CONDUCTIVE ELECTRODE

918 — GROW OR DEPOSIT THIRD DIELECTRIC LAYER (e.g., NITRIDE LAYER)

920 — ETCH WINDOWS TO FIRST AND SECOND CONDUCTIVE CONTACTS

922 — DEPOSIT AND ETCH EXTENSIONS TO FIRST AND SECOND CONDUCTIVE CONTACTS, UPPER CONDUCTIVE ELECTRODE OVER MIDDLE CONDUCTIVE ELECTRODE

FIG. 9

HIGH-VOLTAGE DEPLETION-MODE CURRENT SOURCE, TRANSISTOR, AND FABRICATION METHODS

CROSS-REFERENCE TO RELATED APPLICATION

This application claims priority to U.S. provisional patent application No. 63/210,801, filed Jun. 15, 2021, which is hereby incorporated by reference in its entirety.

TECHNICAL FIELD

This description relates generally to semiconductor fabrication, and more particularly to a high-voltage depletion-mode current source, a high-voltage depletion-mode transistor, and to a methods of fabricating a depletion-mode current source or transistor in an enhancement-mode process.

BACKGROUND

A current source is an electronic circuit that delivers or absorbs an electric current that is independent of the voltage across the current source, at least for some range of voltages. A simple non-ideal current source can consist of a voltage source in series with a resistor. The amount of current provided from such a current source is given by the ratio of the voltage drop across the resistor to its resistance, in accordance with Ohm's law.

Gallium nitride (GaN) field-effect transistors (FETs) offer weight, size, cost, switching-speed, and energy-consumption advantages over silicon FETs, and are used in such applications as 5G rectifiers, motor drives, and AC-to-DC power converters as may be used to power portable computers and charge mobile device batteries. GaN devices come in enhancement mode (e-GaN) and depletion mode (d-GaN) types. Whereas a depletion-mode device is normally on when its gate-source voltage is zero, an enhancement-mode FET is normally off when its gate-source voltage is zero. An enhancement-mode FET can be turned on by maintaining the gate voltage to be more than the source voltage in NMOS circuits and less than the source voltage in PMOS circuits. Enhancement-mode FETs are commonly used as power switches.

In solid-state physics, a two-dimensional electron gas (2DEG) is a gas of electrons that is tightly confined to two dimensions within a semiconductor structure. The tight confinement of the electron gas leads to quantized energy levels for motion in the third dimension. Thus, the electrons appear to be a two-dimensional sheet embedded in the three-dimensional semiconductor structure. An analogous construct of holes, rather than electrons, is called a two-dimensional hole gas (2DHG).

SUMMARY

An example is an integrated circuit (IC) that includes a two-terminal depletion-mode current source. The current source includes a 2DEG or 2DHG channel coupled between a first terminal of the depletion-mode current source and a second terminal of the depletion-mode current source. A conductive electrode coupled to the first terminal is above and extends over at least a portion of the 2DEG or 2DHG channel.

An example method of fabricating an IC includes forming a first semiconductor layer over a substrate and forming a second semiconductor layer over the first semiconductor layer. The first and second semiconductor layers are configured to support a 2DEG or 2DHG. The method further includes forming a depletion-mode current source on the IC. The forming the depletion-mode current source includes patterning a 2DEG or 2DHG channel over the first semiconductor layer to provide a patterned area of the 2DEG or 2DHG channel. The forming the depletion-mode current source further includes forming a dielectric layer over the second semiconductor layer, and etching the dielectric layer to open first and second contact windows to the 2DEG or 2DHG channel. The forming the depletion-mode current source further includes forming one or more contact layers (e.g., by depositing and etching the one or more ohmic layers), at least in part within the first and second contact windows, to provide first and second contacts to respective ends of the 2DEG or 2DHG channel, at least one of the first and second contacts including a conductive electrode above the dielectric layer and extending over at least a portion of the 2DEG or 2DHG channel between the first and second contacts. A portion of the conductive electrode extends over a point on the 2DEG or 2DHG channel. A first distance along the 2DEG or 2DHG channel between the point and the first terminal is greater than a second distance along the 2DEG or 2DHG channel between the point and the second terminal. First wiring is provided to the first contact and second wiring is provided to the second contact to provide the depletion-mode current source as a two-terminal device.

Another example is an IC that includes an enhancement-mode GaN FET, a resistor having a semiconductor—semiconductor interface supportive of a two-dimensional electron gas (2DEG) or a two-dimensional hole gas (2DHG), a metal-insulator-metal (MIM) capacitor, and a depletion-mode current source. The current source includes the semiconductor—semiconductor interface patterned over an area to provide a 2DEG or 2DHG channel in the patterned area. The current source further includes a metal field plate coupled to a negative terminal of the depletion-mode current source, the metal field plate extending over a portion of the patterned area.

Another example is an IC that includes a depletion-mode transistor. The depletion-mode transistor includes a 2DEG or 2DHG channel coupled between a drain terminal of the depletion-mode transistor and a source terminal of the depletion-mode transistor. A conductive gate electrode coupled to a gate terminal of the depletion-mode transistor is above and extends over at least a portion of the 2DEG or 2DHG channel.

An example method of fabricating an IC includes forming a first GaN-based semiconductor layer over a substrate and forming a second GaN-based semiconductor layer over the first semiconductor layer. The first and second semiconductor layers can, for example, be configured to support a 2DEG or 2DHG in a 2DEG or 2DHG channel. The method further includes patterning the first and second GaN-based semiconductor layers to form a first epi-structure in a depletion-mode transistor area, a second epi-structure in a resistor area, and a third epi-structure in an enhancement-mode FET area. The method further includes forming a dielectric layer over the second semiconductor layer. The method further includes etching the dielectric layer to open first and second contact windows at opposite ends of the first epi-structure. The method further includes forming, at least in part within the first and second contact windows, one or more contact layers to provide first and second contacts, and a conductive gate electrode above the dielectric layer and extending over at least a portion of the first epi-structure.

BRIEF DESCRIPTION OF THE DRAWINGS

FIG. 3A is a block diagram of an example start-up circuit that can be used in the power converter system of FIG. 2.

FIGS. 3B-3E are timing diagrams that illustrate examples of the start-up voltage and current levels relative to each other and with respect to time.

FIG. 9 is flow diagram showing an example method of fabricating a depletion-mode current source on an IC.

DETAILED DESCRIPTION

Certain electrical circuits are designed to start upon application of power, such as power supplies for device-charging systems. In some cases, the applied power is in the form of a high voltage, and start-up circuitry must have high-voltage withstanding capabilities. High voltage start-up circuits often include a high-voltage, normally on transistor, such as a junction field-effect transistor (JFET) or other depletion-mode transistor. When power is initially applied, the normally on transistor can turn on without an auxiliary supply voltage. The normally on transistor is then used to charge a capacitor until an allowed value for the supply voltage is reached. The normally on transistor thus operates as a current source at start-up, and other circuitry can disable the normally on transistor after start-up for low-leakage post-start-up operation. However, using an external (off-die) JFET or other external depletion-mode transistor is expensive in terms of production cost and circuit area, and a JFET or other depletion-mode transistor cannot as yet be integrated in an enhancement-mode GaN fabrication process without increasing the mask count and making other changes to the fabrication process flow, thus increasing die fabrication cost. The depletion-mode current source devices described herein can be fabricated in a process designed for construction of enhancement-mode FETs, without requiring modifications to the enhancement-mode processes, such as requiring additional masks or materials. The current source devices and associated fabrication methods described herein thus solve the problem of providing a start-up circuit useful in, e.g., AC-to-DC power converters without requiring an off-die depletion-mode FET or expensive changes to the enhancement-mode process that would be needed to fabricate enhancement-mode and depletion-mode FETs on the same die.

Figure 1:
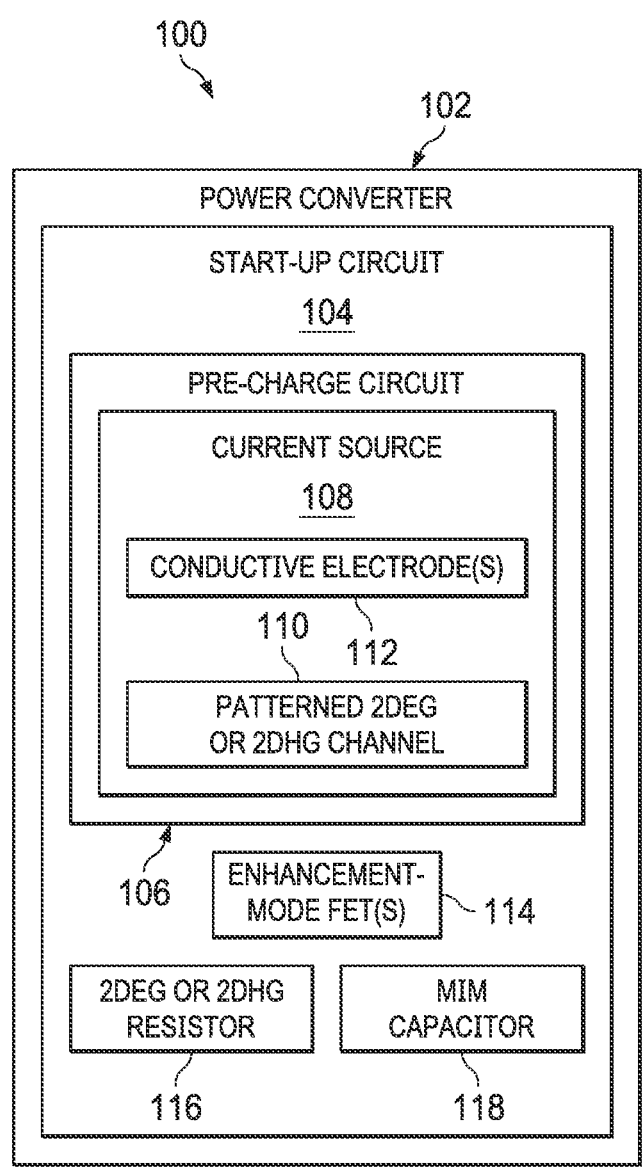
FIG. 1 is a block diagram showing an example power converter system that includes a 2DEG- or 2DHG-based current source in a pre-charge circuit of a start-up circuit.

The block diagram of FIG. 1 illustrates a system 100 for power conversion with a current source 108 that can form all or part of a pre-charge circuit 106 in a start-up circuit 104 in a power converter 102. Power converter 102 can be, e.g., an AC-to-DC power converter, such as may be used to charge a battery in a cellular phone or other mobile device. Power converter 102 is capable of starting up on its own when plugged in to a grid voltage. The current source 108 includes a patterned resistive 2DEG or 2DHG channel 110 and one or more conductive electrodes 112 (e.g., metal field plates) arranged over the channel 110 such that the conductive electrodes provide coverage over the channel 110 in a top-down view of the channel. Examples of such electrodes are discussed below with reference to the example current source 426 shown in FIG. 4A, with electrodes 434, 436, 438 being illustrated therein.

The channel 110 can be formed by an interface between two or more semiconductor layers capable of supporting a 2DEG or a 2DHG, and all or a portion of the channel can be defined, e.g., by a damage implant or mesa etch, into a channel pattern, e.g., a serpentine channel pattern, within a patterned area, as viewed in a top-down view of the channel. An example resistive channel patterning is illustrated in the top-down view of FIG. 5. The one or more conductive electrodes 112 can extend over or overlie the entirety of or a substantial portion of the resistively patterned area of the channel 110. As used herein, "overlie" and variants thereof refer to substantial spatial intersection in a top-down view, and does not require direct contact between the metal of one of the conductive electrodes 112 and semiconductive layers forming the channel 110. For example, there may be one or more dielectric (e.g., nitride) layers between the channel 110 and the one or more conductive electrodes 112. For example, at least one of the one or more conductive electrodes 112 can overlie at least 10% of the patterned area of the channel 110 in the current source 108. For example, at least one of the one or more conductive electrodes 112 can overlie at least 20% of the patterned area of the channel 110. For example, at least one of the one or more conductive electrodes 112 can overlie at least 50% of the patterned area of the channel 110. For example, at least one of the one or more conductive electrodes 112 can overlie at least 80% of the area of the channel 110. In some examples, the one or more conductive electrodes 112 overlie all of the area of the resistively patterned portion of the channel 110. The precise percentage of spatial intersection between the at least one of the one or more conductive electrodes 112 and the patterned area of the channel 110 in a top-down view can depend upon the configuration of the channel and the desired saturation current and pinch-off voltage of the current source 108.

Start-up circuit 104 can also include one or more enhancement-mode FETs 114, at least one resistor that includes a 2DEG or 2DHG channel, and a metal-insulator-metal (MIM) capacitor fabricated on the same die as the current source 108. Start-up circuit 104 in power converter 102 can include a high-voltage, low-current DC path (not shown). When the power converter is coupled to an AC or DC power source (e.g., plugged into a wall outlet supplying AC power), the DC path provides a DC current from the start-up circuit 104 without having a control voltage applied. The DC current may need to be small enough to fulfill standby power requirements. The DC current can be used to power-up a supply voltage for the power converter 102 in order to start up.

In contrast to resistor 116, current source 108 has a sufficiently low saturation current, and can thus provide the DC path with a current less than, e.g., 10 μA from 400 V. Should the resistor 116 be used for such a purpose (as a current source), the required resistor would need more than 1 mm² in die area, which would drastically increase die cost. System 100 with current source 108 permits an integrated start-up circuit 104 in a power converter IC fabricated with an all-enhancement-mode process, such as an enhancement-mode GaN process, in which a depletion-mode transistor device is not available or would require additional photolithography masks. Current source 108 provides a depletion-mode device with a current source characteristic, capable of handling high voltages, e.g., at least up to 650 V, can be fabricated on the same die as an enhancement-mode FET 114 (e.g., a GaN FET) without the need to modify, with additional mask layers or materials, the enhancement-mode fabrication process used to create the FET 114. The depletion-mode current source 108 can be used as pre-charge device to turn on an enhancement-mode transistor (e.g., FET 114) to build up a supply voltage for the power converter 102.

As an example, depletion-mode current source 108 can be formed in an enhancement-mode GaN fabrication process by placement of a conductive material (e.g., metal) as one or more conductive electrodes 112, sometimes referred to herein as field plates, over patterned 2DEG or 2DHG channel 110. Field plates 112 can be connected to the low-voltage ("source") terminal of the current source 108. The negative potential difference between the 2DEG or 2DHG channel 110 and the overlying field-plate metal partially depletes the 2DEG or 2DHG channel 110 and the saturation current of the device is reduced, as compared to resistor 116, which can otherwise be constructed similarly but without the field plate(s) 112. The resulting current can be set by the nominal resistance of the patterned 2DEG or 2DHG channel 110. The operation of the current source 108 resembles the operation of a depletion mode device, with a high-voltage terminal of the resistor being a drain, the metal field plating being a gate, and a low-voltage terminal being a degenerated source. Current source 108 can be implemented in an enhancement-mode-only process without additional masks beyond those used to fabricate enhancement-mode devices. Fabrication of a current source having an output current between about 100 nA and about 10 μA suffices for start-up circuit applications, which do not require high accuracy in the output current of the fabricated current source.

Figure 2:
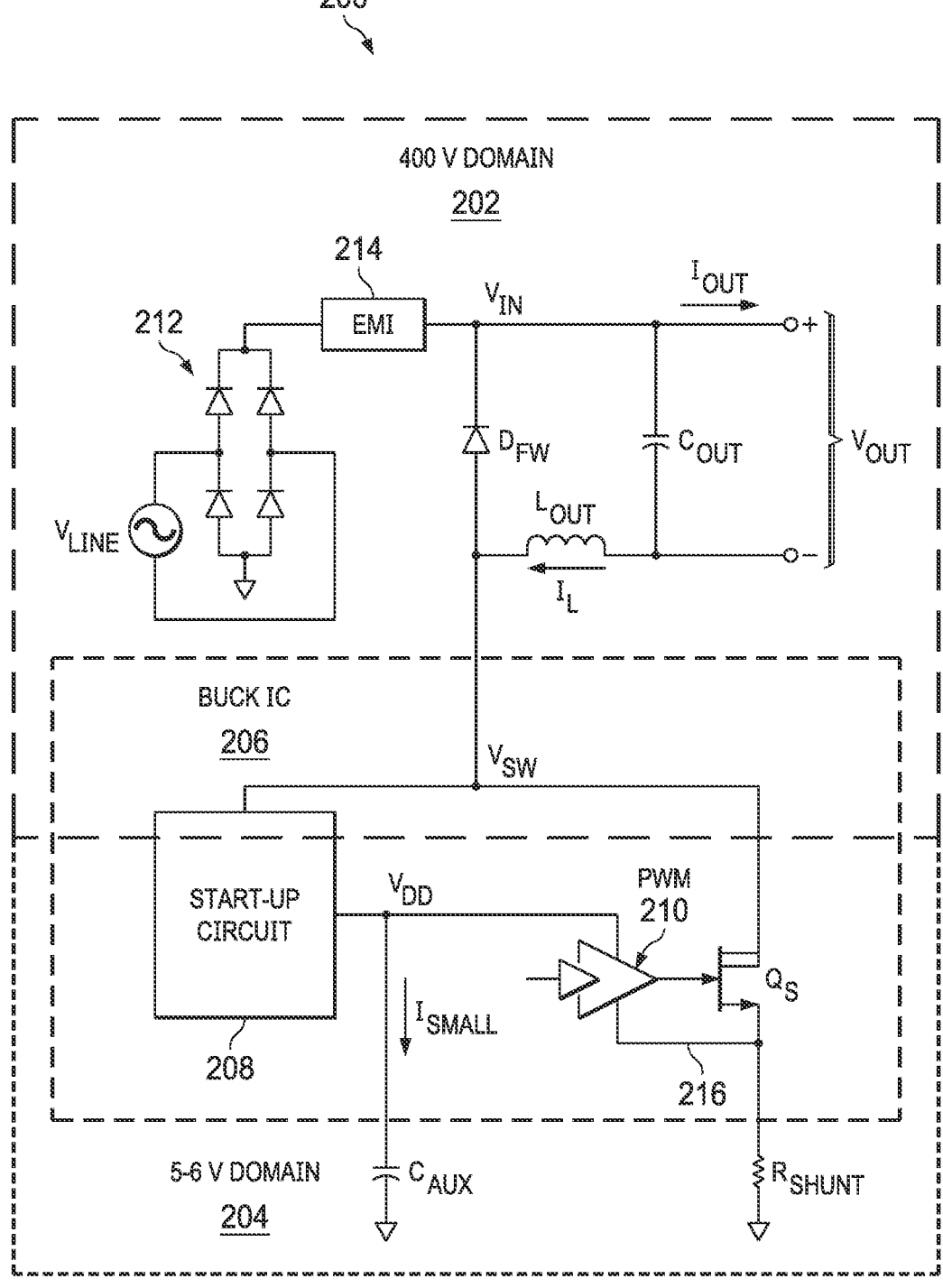
FIG. 2 is a block diagram of an example power converter system including a start-up circuit.

The block diagram of FIG. 2 shows an example power converter system 200 that can be coupled to an AC power source (e.g., by plugging in the converter or a device incorporating the converter to a wall outlet) providing an AC voltage $V_{LINE}$. As an example, the power converter can be implemented in a pluggable power supply for a mobile device (e.g., mobile phones or tablet or notebook computers). Power converter system 200 includes an AC-to-DC power converter having a high-voltage portion 202 operating in a high-voltage domain (e.g., an about 400 V domain) and a low-voltage portion 204 operating in a low-voltage domain (e.g., an about 5 to 6 V domain). The high-voltage portion 202 can be configured to implement AC-to-DC conversion. A buck regulator, which can include a buck IC 206, auxiliary capacitor $C_{AUX}$, and shunt resistor $R_{SHUNT}$, is configured to step down the DC voltage $V_{IN}$— GROUND to a lower voltage $V_{OUT}$ usable by the power-consuming device to which the power converter system 200 supplies power. The buck IC 206 can include a start-up circuit 208, coupled between switch voltage node $V_{SW}$ and drain voltage node $V_{DD}$, and a pulse-width modulator (PWM) 210 that controls a switch, illustrated in the example system 210 as FET Qs, the gate of which is coupled to the control output of PWM 210. Auxiliary capacitor $C_{AUX}$ is coupled between drain voltage node $V_{DD}$ and ground. The switch voltage at node $V_{SW}$ is actively switched by the main power FET Qs of the converter, and the drain of power switch Qs is thus coupled to node $V_{SW}$. The source of FET Qs is coupled to shunt resistor $R_{SHUNT}$. Circuitry in the high-voltage domain 202 can include a diode bridge rectifier 212, electromagnetic interference (EMI) filter 214, freewheeling diode $D_{FW}$, output capacitor $C_{OUT}$, and output inductor $L_{OUT}$. The diode bridge rectifier 212 is coupled between positive and negative terminals of high-voltage AC source $V_{LINE}$, and also between ground and the EMI filter 214. The EMI filter 214 is coupled between the diode bridge rectifier 212 and input voltage node $V_{IN}$. The freewheeling diode $D_{FW}$ is coupled between switch voltage node $V_{SW}$ and input voltage node $V_{IN}$. The output capacitor $C_{OUT}$ is coupled between the negative and positive terminals of the output, having voltage difference $V_{OUT}$, the positive output terminal being the input voltage node $V_{IN}$. The output inductor LOUT is coupled between the negative terminal of the output and the switch voltage node $V_{SW}$. The output voltage $V_{OUT}$ of the converter system 200 is measured across output capacitor $C_{OUT}$. The converter system 200 can require a certain minimum supply voltage in order to operate switching components PWM 214 and FET Qs, including a control loop formed by the connection between the output of PWM 210 and the gate of FET Qs and the feedback connection 216 between the source of FET Qs and the PWM 210.

System start-up for the power converter system 200 occurs, for example, when the power converter system 200 is first plugged into a wall outlet, or otherwise when AC voltage $V_{LINE}$ is first provided. The controller that includes PWM 210 can require the potential at the start-up circuit output node $V_{DD}$ to be a sufficiently a low voltage (e.g., 5 V, 10 V, or 15 V) to start its control operation. Until the requisite level of voltage is available at the start-up circuit output node $V_{DD}$, the controller cannot operate, and start-up cannot be controlled. It may not be possible to turn on an enhancement-mode FET to generate the requisite voltage at start-up circuit output node $V_{DD}$, because an enhancement-mode FET is normally off when its gate-source voltage is zero, and at start-up, no powered controller is available to control the FET to turn on.

A depletion-mode device, which is normally-on (with the channel below the gate being partially or fully on at 0 V gate bias), can be used to provide a small current $I_{SMALL}$ at start-up that slowly charges auxiliary capacitor $C_{AUX}$ until the voltage at node $V_{DD}$ is sufficient (e.g., about 5 V to about 15 V) to power the controller, which is PWM 210 in the illustrated example. The small current $I_{SMALL}$ is on for as long as AC voltage $V_{LINE}$ is provided (e.g., for as long as long as the power converter system 200 is plugged in to a wall outlet). To meet a standby power requirement, the small current $I_{SMALL}$ should not be higher than 10 μA. Use of an off-chip device, such as a discrete JFET or other discrete depletion-mode transistor on a PCB, to provide the small current $I_{SMALL}$ adds cost and complexity to converter system 200. A 2DEG-based current source, as described herein, can provide an on-chip device (a device on the buck IC 206) that can be fabricated using the same process flow used to fabricate a high-voltage (e.g., 650 V) e-GaN FET.

FIG. 3A is a block diagram of an example start-up circuit 300 that can be used to implement start-up circuit 208 of FIG. 2. Start-up circuit 300 includes an enhancement-mode transistor $Q_1$, current-limiting transistor $Q_2$, current-limiting resistor $R_{LIM}$, capacitor $C_1$, and voltage regulation circuitry including comparator (e.g., op-amp) 304, to which is provided non-zero reference voltage $V_{REF}$ at a negative input terminal and drain voltage $V_{DD}$ at a positive input terminal, and which in turn supplies voltage regulation output voltage $V_{SD}$. The drain of enhancement-mode transistor $Q_1$ is coupled to the switch voltage node $V_{SW}$, as is the positive terminal of pre-charge circuit 302. The gate of enhancement-mode transistor $Q_1$, the drain of current-limiting transistor $Q_2$, and the positive terminal of capacitor $C_1$ are coupled to the negative terminal of pre-charge circuit 302 at voltage node $V_{GS1}$. The drain of enhancement-mode transistor $Q_1$ is coupled to the gate of current-limiting transistor $Q_2$ and to a first terminal of current-limiting resistor $R_{LIM}$ at voltage node $V_{S1}$. The source of current-limiting transistor $Q_2$ is coupled to a negative terminal of capacitor $C_1$ and to a second terminal of current-limiting resistor $R_{LIM}$ at drain voltage node $V_{DD}$. Auxiliary capacitor $C_{AUX}$ of FIG. 3A, coupled between drain voltage node $V_{DD}$ and ground, corresponds to auxiliary capacitor $C_{AUX}$ of FIG. 2. On system start-up, pre-charge circuit 302 provides a small constant current from start-up circuit input voltage node $V_{SW}$, which corresponds to the switch voltage node $V_{SW}$ in FIG. 2. The pre-charge circuit 122 provides a charge to node $V_{GS1}$ at the gate of enhancement-mode transistor $Q_1$ to turn on enhancement-mode transistor $Q_1$. Capacitor $C_1$ is coupled between the gate of enhancement-mode transistor $Q_1$ and the start-up circuit output node $V_{DD}$, which corresponds to the same-named node in FIG. 2.

Even if the rate of increase in the start-up circuit input voltage $V_{SW}$ is insufficient to turn on enhancement-mode transistor $Q_1$, the rising slope of start-up circuit input voltage $V_{SW}$ at the input of the pre-charge circuit 302 turns on the pre-charge circuit 302, which then charges the capacitor $C_1$ and the gate-source capacitance of the enhancement-mode transistor $Q_1$, which causes enhancement-mode transistor $Q_1$ to turn on. FIGS. 3B-3E illustrate examples of the start-up voltage and current levels relative to each other and with respect to time. FIG. 3B shows the rise of voltage at the start-up circuit input node $V_{SW}$. FIG. 3C shows the slightly later rise of the voltage at node $V_{GS1}$ at the output of pre-charge circuit 302 and the gate of enhancement-mode transistor $Q_1$. FIG. 3D shows the still later rise of current $I_{D1}$ between the start-up circuit input node $V_{SW}$ and the drain of enhancement-mode transistor $Q_1$. FIG. 3E shows the still later rise of voltage at the start-up circuit input node $V_{DD}$.

A normally off enhancement-mode FET is not a suitable device to implement pre-charge circuit 302, because an enhancement-mode device is not cable of turning on at circuit start-up when its gate-source voltage is zero. Pre-charge circuit 302 could be implemented as a normally on depletion-mode FET. However, because enhancement-mode transistors and depletion-mode transistors can require different masks in the fabrication process, it is not straightforward to integrate both enhancement-mode transistors, such as enhancement-mode FET $Q_1$, and a depletion-mode transistor, such as would be used to implement pre-charge circuit 302, on the same wafer. Thus, implementation of pre-charge circuit 302 as a depletion-mode FET could either require making the depletion-mode FET an off-chip component or modifying the process used to fabricate the enhancement-mode FET $Q_1$ to accommodate fabrication of a depletion-mode device, both of these options adding cost and complexity to production of start-up circuit 300.

Figures 4A, 4B:
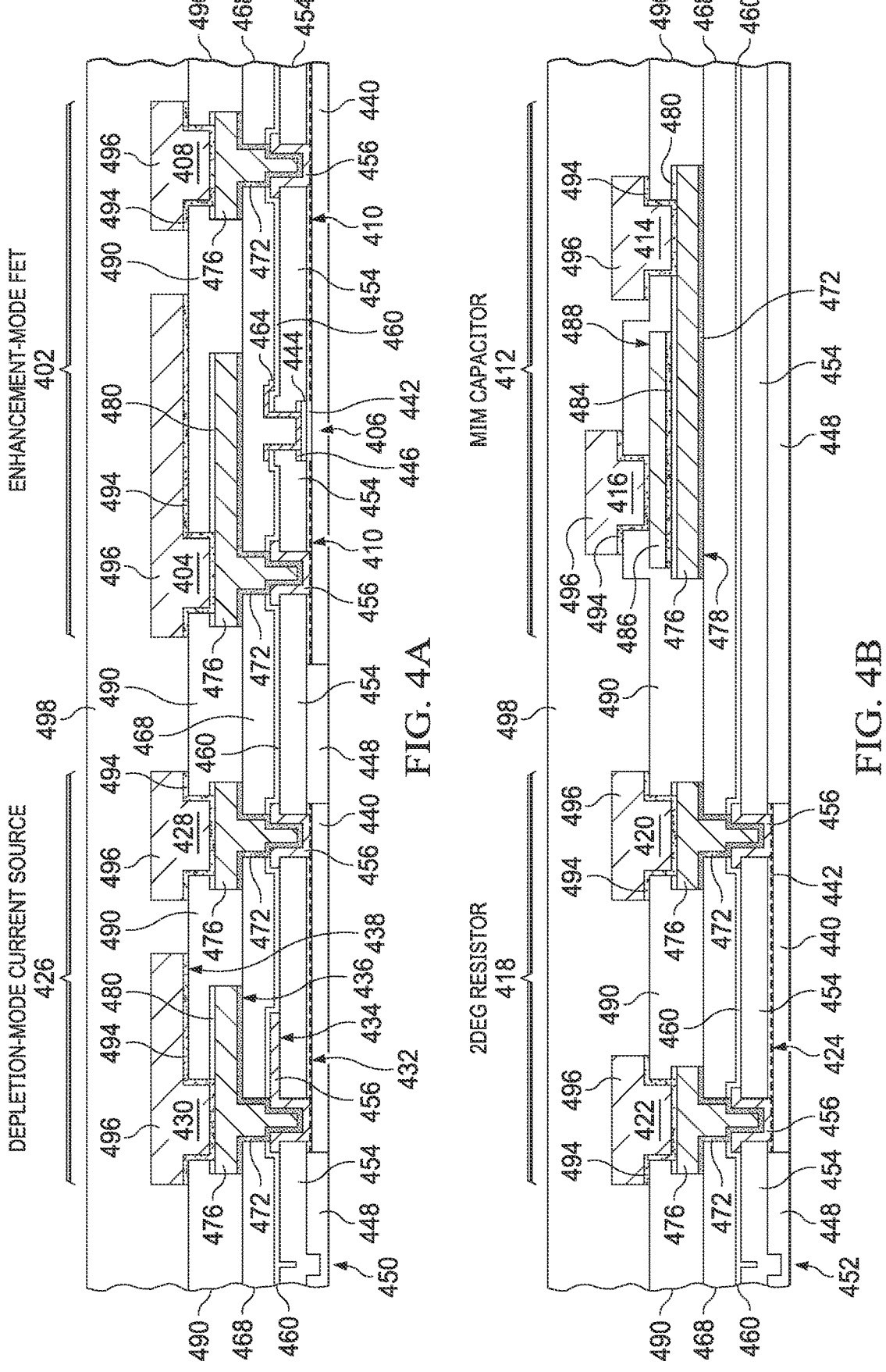
FIGS. 4A and 4B are cross-sectional views of four example devices fabricated according to an enhancement-mode fabrication process.

FIGS. 4A and 4B are cross-sectional views of four example devices fabricated according to an enhancement-mode fabrication process. The four devices 402, 412, 418, 426 can thus be fabricated on the same wafer and die, and multiple instances of these devices can be fabricated and wired together to form electronic circuits. FIG. 4A is a cross-section showing an example high-voltage (e.g., 650 V) enhancement-mode FET 402 having a metal source terminal 404, a gate 406, and a metal drain terminal 408. The channel of the enhancement-mode FET 402 accommodates a 2DEG 410 having a very thin sheet of electrons. The 2DEG is indicated in FIGS. 4A and 4B as a broken horizontal line. FIG. 4A further shows a depletion-mode current source 426 having a first metal terminal 428 and a second metal terminal 430. Depletion-mode current source 426 can use the same channel layers as used by the enhancement-mode FET 402. The channel of the depletion-mode current source 426 accommodates a 2DEG 432. Depletion-mode current source 426 includes field plates 434, 436, 438 overlying the 2DEG 432. The field plates 434, 436, 438 enable the current source 426 to operate at high input voltages, e.g., of up to 650 V or 1,000 V. As an example, a middle field plate 436 can completely overlie a lower field plate 434, and an upper field plate 438 can completely overlie the middle field plate 436. FIG. 4B is a cross-section showing a MIM nitride-film capacitor 412 having a first metal terminal 414 and a second metal terminal 416. Nitride-film capacitor 412 can be made using the same process flow as the enhancement-mode FET 402, without additional materials or masks in some examples, or in other examples with only one additional mask layer. FIG. 4B further shows a 2DEG-based resistor 418 having a first metal terminal 420 and a second metal terminal 422. 2DEG-based resistor 418 can use the same channel layers as used by the enhancement-mode FET 402. The channel of the resistor 418 accommodates a 2DEG 424. The 2DEG-based resistor 418 can likewise be made using the same process flow as the enhancement-mode FET 402, without additional materials or masks.

Because all four devices 402, 412, 418, 426 can use the same materials and masks, all four devices can be fabricated on the same wafer and die as part of a single IC. A number of material layers can be used in forming the four different devices 402, 412, 418, 426 of FIGS. 4A and 4B. An epi-structure used to create the 2DEGs 410, 424, 432 can include a first semiconductor layer 440, e.g., of GaN, and a second semiconductor layer (barrier) layer 442, e.g., of aluminum gallium nitride (AlGaN), at the interface of which the 2DEGs 410, 424, 432 reside. A third layer 444 of doped semiconductor in the epi-structure can be used to create the gate 406 of FET 402. This doped semiconductor can be, for example, GaN doped p-type (p-GaN). This third layer 444 can be topped by a thin passivation layer 446 of, e.g., silicon nitride (SiN). At certain locations 448, the epi-structure can be damaged or layer 442 can be mesa etched away to isolate the devices 402, 412, 418, 426 from each other and/or to create patterns in the epi-structure, such as a serpentine pattern used in forming the 2DEG resistor 418 and the current source 426, as described below with regard to FIG. 5. Alignment marks 450, 452 can be etched to allow photolithography tools to align to the wafer.

First dielectric layer 454 can be, e.g., a nitride film. First contact metal layer 456, which forms part of the ohmic contacts 404, 408, 420, 422, 428, 430 to the 2DEG 410, 424, 432, can be, e.g., a multi-layer including a layer of titanium (Ti), a layer of an aluminum-copper alloy (AlCu) above the layer of Ti, a layer of titanium nitride (TiN) above the layer of AlCu, and a layer of titanium-tungsten allow (TiW) above the layer of AlCu. In the illustrated example, first contact metal layer 456 forms the lower field plate 434 of current source 426. Second dielectric layer 460 prevents shorting of the first contact metal layer 456 to second contact metal layer 472. Second dielectric layer 460 can be, e.g., a nitride film. Gate metal layer 464 forms the gate of enhancement-mode FET 402 and can be, e.g., TiW.

Third dielectric layer 468 can be, e.g., a nitride film. First glue layer 472 can be, e.g., TiW. Second contact metal layer 476 can be, e.g., AlCu. In the illustrated example, first glue layer 472 and second contact metal layer 476 together form both the lower plate 478 of MIM capacitor 412 and the middle field plate 436 of current source 426. Fourth dielectric layer 480, which can form the inter-plate dielectric of MIM capacitor 412, can be, e.g., a nitride film. Second glue layer 484 can be, e.g., TiW. Third contact metal layer 486 can be, e.g., AlCu. In the illustrated example, second glue layer 484 and third contact metal layer 486 together form the upper plate 488 of MIM capacitor 412.

Fifth dielectric layer 490 can be, e.g., a PECVD nitride film. Third glue layer 494 can be, e.g., TiW. Fourth contact metal layer 496 can be, e.g., AlCu. In the illustrated example, third glue layer 494 and fourth contact metal layer 496 together form the upper field plate 438 of current source 426. Sixth dielectric layer 498 can form a protective overcoat (PO) and can include, e.g., a lower oxide layer and an upper nitride film layer. As examples, the lower oxide layer can be silicon dioxide ($SiO_2$) formed using tetraethyl orthosilicate (TEOS), and the upper nitride film layer can be SiN. In other examples, not illustrated, the PO may be omitted, and the devices 402, 412, 418, 426 may be directly coated with one or more polyimide coatings or other polymer-based films.

During operation of any of devices 402, 418, 426, a corresponding 2DEG 410, 424, 432 forms right below the interface between the first semiconductor layer 440 and the second semiconductor layer 442 (e.g., right below the GaN/AlGaN interface, if first semiconductor layer 440 is a relatively thick layer of GaN and second semiconductor layer 442 is a relatively thin layer of AlGaN). Although 2DEG 410, 424, 432 is illustrated as a broken line, in three dimensions, the 2DEG is an electron cloud that has a carrier distribution in the vertical dimension with a centroid that can be, for example, about 2 nm below the interface between the first semiconductor layer 440 and the second semiconductor layer 442. In some examples, instead of having an epi-structure that supports a 2DEG, devices 402, 481, 426 can have an epi-structure that supports a 2DHG (enables the presence of hole gas), e.g., by providing a second thick GaN layer above the thin AlGaN layer, such that a hole gas would form just above the upper GaN/AlGaN interface. References herein to a 2DEG should be understood to include a 2DHG in such alternate examples.

Figure 5:
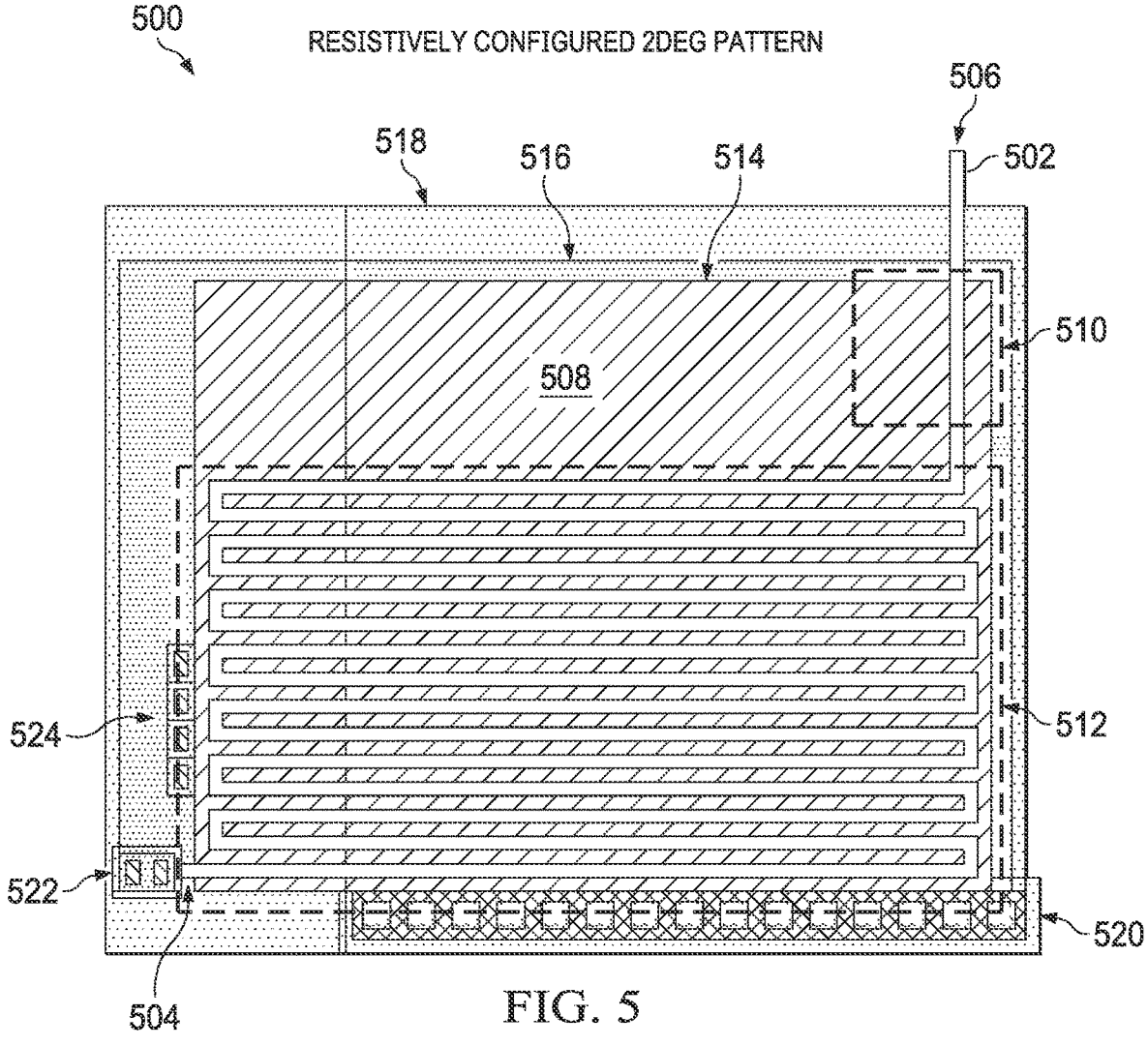
FIG. 5 is a top-down view of an example resistive patterned area of a 2DEG or 2DHG channel.

FIG. 5 is a top-down view of an example resistively configured 2DEG channel pattern 502 that can be used to confine all or a portion of 2DEG 424 in resistor 418 or 2DEG 432 in current source 426 (or a corresponding 2DHG in examples that use a 2DHG as an alternative to a 2DEG). The resistively configured 2DEG pattern 502 is confined within the area illustrated in FIG. 5 and is illustrated as including a non-serpentine portion within region 510 and as including a regularly serpentine portion within region 512, but, in other examples (not illustrated), can take other two-dimensional forms that accomplish the same resistive effect in which a voltage drop is observed between a first end 504 of pattern 502 (e.g., at the bottom-left of FIG. 5) and a second end 506 of channel pattern 502 (e.g., at the top-right of FIG.

5) within the patterned area. Ohmic contacts can be made (e.g., by metal terminals 420 and 422, respectively, in resistor 418, or by metal terminals 428 and 430, respectively, in current source 426 in FIG. 4) to the first end 504 and the second end 506 of the channel pattern 502. Area 508, covering all area outside the channel 502, which does not support a 2DEG and defines the resistively configured 2DEG pattern 502, can be created, for example, by the same epi-structure damage or mesa etch process used to create device isolation divisions 448 shown in FIGS. 4A and 4B. As shown in FIG. 4, the field plates 434, 436, 438 overlying the resistively configured 2DEG 432 in current source 426 can be conductively connected with terminal 430, which can serve as the negative port (lower voltage port or "source" port) of current source 426. When a voltage is applied across terminals 428, 430 of current source 426, especially in area 506, but also everywhere else below the metal field plates 434, 436, 438, a negative control voltage that is less than the voltage at the positive terminal 428 partly depletes the 2DEG 432 in resistively configured 2DEG pattern 502, as long as a current flow and voltage drop is present across the resistively configured 2DEG pattern 502. The saturation current of current source 426 is thereby reduced, and can be set, for example, by configuring the area of the patterned portion of the resistively configured 2DEG pattern 502. Field plates 434, 436, 438 thus allow a high voltage (e.g., 650 V or higher) to be applied to one end (e.g., end 504) of the resistively configured 2DEG pattern 502 in current source 426 (e.g., at terminal 428), while maintaining very high resistance across the 2DEG pattern 502 in current source 426. For current-sourcing applications, a precision threshold voltage $V_{th}$, as may be required in a transistor, such as FET 402, used for power switching, is not needed for current source 426.

Figure 12:
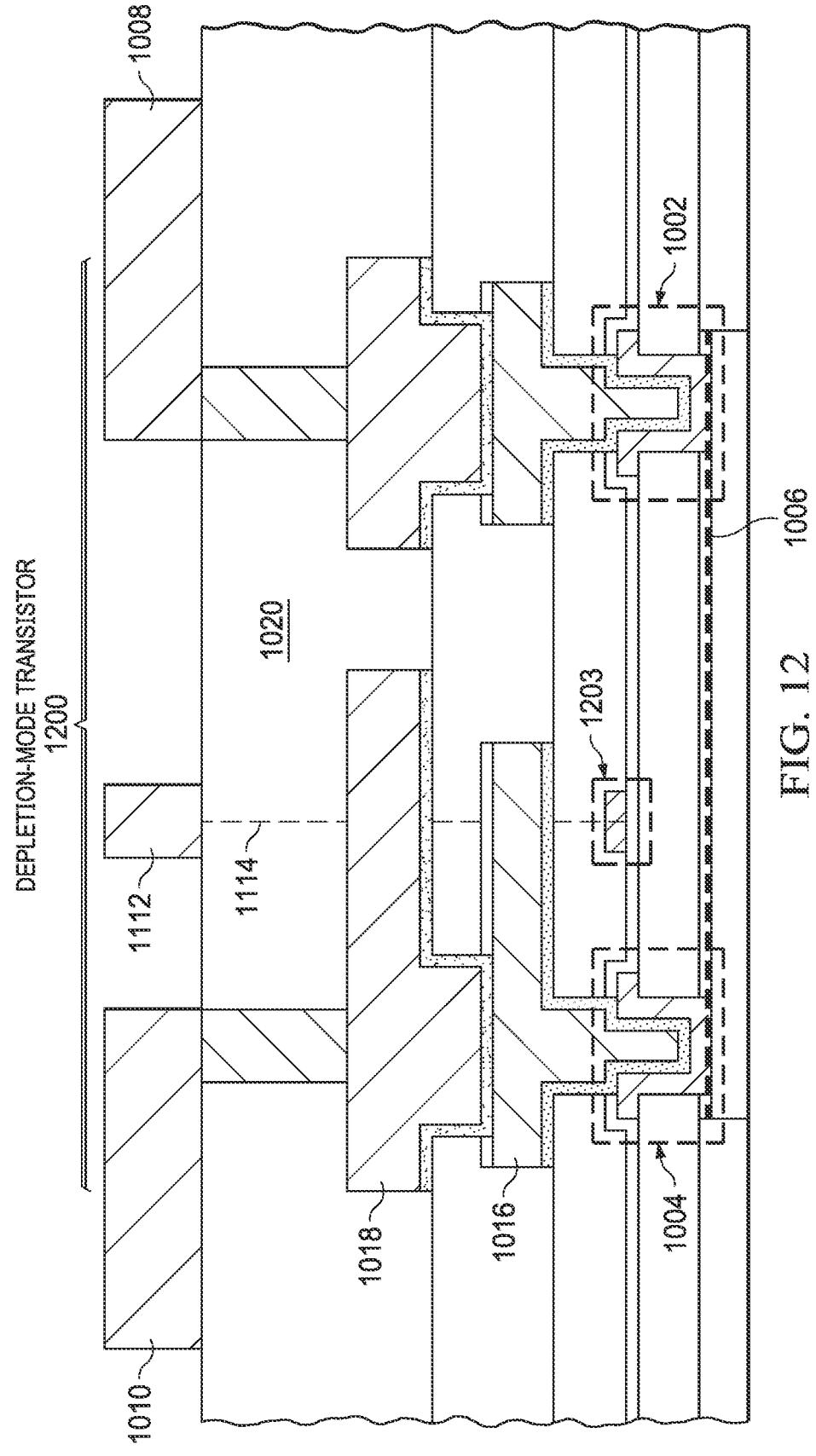

In the illustrated example, area 514 of FIG. 5 corresponds to the overlay of lower electrode 434 of FIG. 4A, area 516 of FIG. 5 corresponds to the overlay of middle electrode 436 of FIG. 4A, and area 518 of FIG. 5 corresponds to the overlay of upper electrode 476 of FIG. 4A. Vias 520 connecting the fourth contact metal layer 496 (used to form the upper electrode 438) with the second contact metal layer 476 (used to form the middle electrode 436) are represented by fifteen small squares at the bottom-right of FIG. 5. Contacts 522 connecting second contact metal layer 476 to first contact metal layer 456 (used to form lower electrode 434), and thus to the 2DEG channel 432, are represented by two rectangles in the bottom-left of FIG. 5. Contacts connecting second contact metal layer 476 to gate metal layer 464, represented by four rectangles on the left side of FIG. 5, can be used in examples where the gate metal layer 464 is used to form the lowest electrode 434 (not shown) or to form a contact-discontinuous gate electrode 1203 of a depletion mode transistor or current source as illustrated in FIG. 12.

The 2DEG (or 2DHG) channel in a GaN device can be likened to an n-type (or, for 2DHG implementations, a p-type) doped region in a silicon-based device, in that the channel is conductive with a limited conductivity or finite resistance (where conductivity is defined as current divided by voltage and resistance is defined as voltage divided by current). As described above with respect to 2DEG (or 2DHG) resistor 418 shown in FIG. 4B, the 2DEG (or 2DHG) channel 424 can be used to form a resistor in GaN similar to how an n-type (or p-type) doped region can be used to form a resistive channel in silicon. When a relatively large resistance (a high voltage drop for low current) is desired, the 2DEG (or 2DHG) channel can be patterned to be relatively narrow and long with respect to the current path. Such a relatively narrow and long pattern 502 is shown in FIG. 5. The density of carriers (electrons in a 2DEG and in n-type silicon, or holes or defect electrons in a 2DHG and in p-type silicon), and thereby the resistance of the channel, can be modulated by an electric field orthogonal to the current flow direction, forming a current source (e.g., depletion-mode current source 426) or a transistor (as described below with regard to FIGS. 11-15). The electric field can be generated, for example, by a potential difference between the 2DEG (e.g., 2DEG 432 in FIG. 4A) and a conductive electrode above (e.g., contact-continuous electrodes 434, 436, 438 in FIG. 4A, showing a current source example, or contact-discontinuous electrodes 1103, 1203, 1303, 1403, 1503, 1507 in FIGS. 11-15, showing transistor or current source examples). The strength of the electric field is defined as the difference in electrical potential between the 2DEG (or 2DHG) and the electrode divided by distance between the 2DEG (or 2DHG) and the electrode. At least a minimum threshold field strength can be provided to modulate the carrier density and thereby the conductivity of the 2DEG (or 2DHG).

Because the minimum threshold field strength is channel-electrode-distance-dependent, there can be different threshold voltages for electrodes at different separation distances (heights) over the 2DEG (or 2DHG), as may be implemented with different metal layers in the current-source or transistor device fabrication process. For example, the threshold voltage for upper electrode 436 of depletion-mode current source 426 in FIG. 4A may be −200 V. As an example, then, a high 400 V potential at end 506 of channel 502 and a low potential of 0 V at electrode-contact connected end 504 of channel 502 results in a potential difference of −400 V between upper electrode 436 and the 2DEG 432 beneath it. The electric field generated by this potential difference reduces the electron density in the 2DEG 432 and increases its resistance. The electron density reduction settles at an equilibrium where the resistance of the 2DEG 432 modulated by the upper electrode 436 is high enough that the current flowing through the 2DEG 432 causes a voltage drop of 200 V in the 2DEG 436. This resistance modulation is most observed in the region of the 2DEG 432 in which the upper electrode 436 is above and nearest to the 2DEG 432, without any intervening conductive layers between the upper electrode 436 and the 2DEG 432. In the view and orientation of FIG. 5, this particular region of resistance modulation is located above the region labeled 510. Thus, in this example, an at least 200 V drop, from 400 V to 200 V, occurs between end 506 of the patterned portion of the channel 502 and a point prior to the top edge of region 516 (corresponding to the overlay of middle electrode 436 of FIG. 4A). For the portion of the 2DEG where the potential is below 200 V, the upper electrode 438 (formed by fourth contact metal layer 496) has effectively no influence on the electrons in the 2DEG.

The middle electrode 436, illustrated in the view of FIG. 5 as area 516, has an influence over the channel 502 that is limited essentially to the region between the upper edge of are 516 and the upper edge of area 514. Between these points in the channel 502, the potential of the 2DEG drops from 200 V to, e.g., 80 V. The lower electrode 434, illustrated in the view of FIG. 5 as area 516, which is illustrated in FIG. 4A as being made from first contact metal layer 456, but which, in some examples, such as that of FIG. 12, can be made from gate metal layer 464, has an influence over the channel 502 that is limited essentially to the upper portion of region 510, in which the potential of the underlying 2DEG drops from 80 V to, e.g., 2 V. Thus, after a very short distance of the length of the channel 502 below the lower electrode 434, amounting to at most approximately 100 nm in the illustrated example, the potential of the 2DEG 432 below the lower metal electrode 434 is less than the threshold voltage for the lower electrode 434. From an electrical point of view, it is immaterial to the functioning of the depletion-mode current source 426 (or a depletion-mode transistor as illustrated in any of FIGS. 11-15, as examples) whether, on the one hand, the metal of the electrode(s) 434, 436, 438 extends over the serpentine portion 512 of the patterned area of the 2DEG, or, on the other hand, the metal of the electrode(s) 434, 436, 438 extends only in the region 510, because the influence of the electrode(s) 434, 436, 438 on the channel is nihil in the portion of the channel 502 between region 510 and channel end 504, the voltage difference between 2DEG and the gate electrode being small in the portion of the channel 502 between region 510 and channel end 504. Within the serpentine pattered region 512, the voltage of the channel 502 can further drop from, e.g., 2 V to the 0 V potential of the end 504 of the channel 502 where it electrically couples to the 0 V contact 430.

The serpentine patterning within region 512 adds resistance to the channel 502 using only a relatively small, close-to-square area. The resistance of serpentine patterning region 512 sets the current of current source 426. With the voltage of the 2DEG in region 510 at 2 V, the current generated by the current source 426 is equal to the 2 V drop over the serpentine patterned portion 512 of the channel 502 divided by the resistance of the serpentine patterned portion 512 of the channel 502. This current is substantially independent of the voltage between channel ends 506 and 504 (between contacts 428 and 430 of current source 426) provided the potential difference between contacts 428 and 430 of the current source 426 is greater than 2 V. The inclusion of one or more metal electrodes (e.g., electrodes 434, 436, 438 in FIG. 4A, or electrodes 1103, 1203, 1303, 1403, 1503, 1507, etc., in FIGS. 11-15) having an about 0 V potential above the patterned area of the 2DEG (or 2DHG) channel close to the high-voltage terminal (contact 428 in FIG. 4A) provides the above-described channel depletion functionality and utility of the device as a depletion-mode current source (or, in some examples, a depletion-mode transistor).

To provide the intended depletion-mode current source or transistor functionality, the one or more metal electrodes of the current source or transistor can therefore be made to overlie at least region 510 close to channel end 506 irrespective of whether the metal electrodes overlie serpentine patterned region 512. Conductively coupling the one or more metal electrodes to channel end 504 (e.g., at contact 430 in FIG. 4A) can cause the depletion-mode device to act as current source rather than a transistor. For example, in a depletion-mode device configured as a two-terminal current source having a first contact set at a first voltage and a second contact configured to be set at a second voltage higher than the first voltage (e.g., at least 400 V higher than the first voltage, e.g., at least 600 V higher than the first voltage), an electrode conductively coupled to the first contact can be configured to overlie a 2DEG or 2DHG channel that runs between the first and second contacts in at least an area that is closer to the second (high-voltage) contact than to the first (low-voltage) contact. As another example, in a depletion-mode device configured as a two-terminal current source having a first contact set at a first voltage and a second contact configured to be set at a second voltage higher than the first voltage (e.g., at least 400 V higher than the first voltage, e.g., at least 600 V higher than the first voltage), an electrode conductively coupled to the first contact can be configured to overlie a point on a 2DEG or 2DHG channel that runs between the first and second contacts (this point corresponding, e.g., to any point on the channel 502 in region 510 in FIG. 5), such that a first distance along the 2DEG or 2DHG channel between the point (in region 510 in FIG. 5) and the first (low-voltage) contact (corresponding, e.g., to channel end 504 in FIG. 5) is greater than a second distance along the 2DEG or 2DHG channel between the point (in region 510 in FIG. 5) and the second (high-voltage) contact (corresponding to channel end 506 in FIG. 5).

Figure 6:
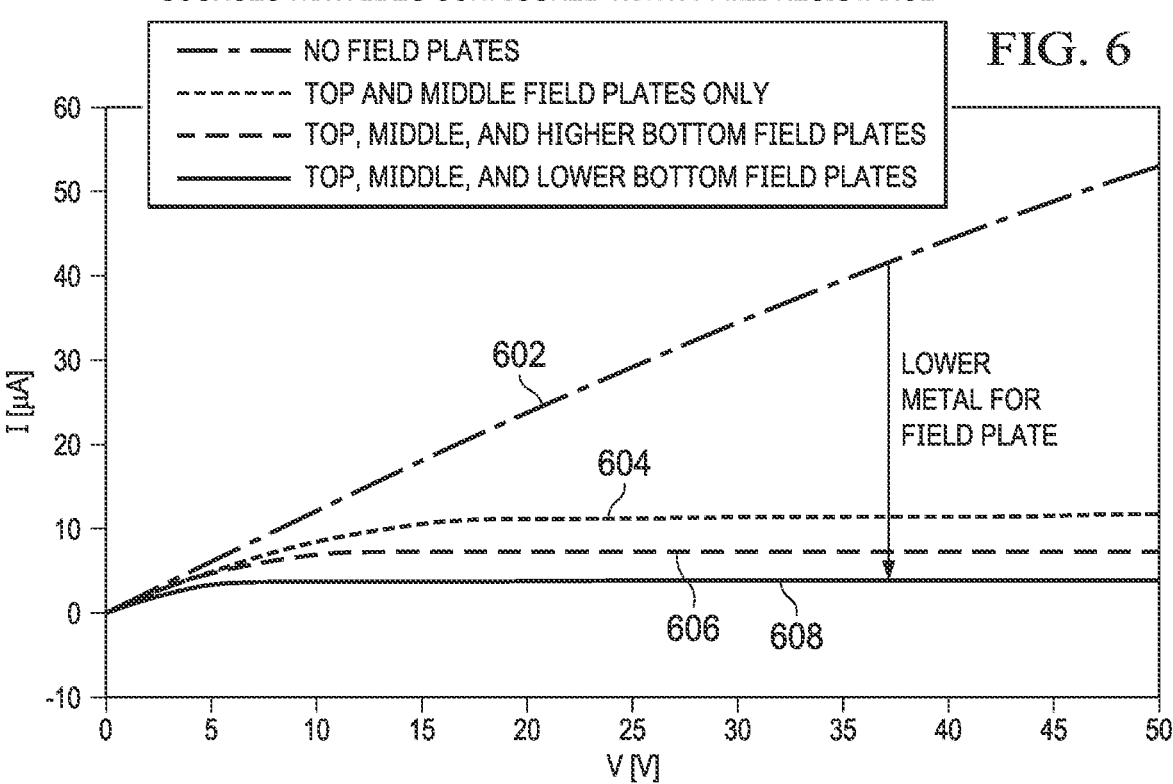
FIG. 6 is a graph of example current-voltage curves for four different 2DEG-based devices, one without any field plates, and three with field plates of varying distances from a 2DEG channel.

The graph of FIG. 6 shows current-voltage (I-V) plots for four different example current sources fabricated like deple-tion-mode current source 426, with varying configurations of field plates. I-V plot 602 corresponds to a device with no field plates, structurally similar to 2DEG resistor 418 of FIG. 4, which does not exhibit the current-saturating behavior desired of a current source device. I-V plot 604 represents a depletion-mode current source having only top and middle field plates 438, 436, in which first contact metal layer 456 is not configured as a field plate and does not substantially overlie 2DEG 432. As shown in FIG. 6, the device represented by I-V plot 604 exhibits current saturation at about 12 μA at potential differences above about 15 V. I-V plot 606 represents a depletion-mode current source having top and middle field plates 438, 436, but with a lower field plate higher than shown in FIG. 4, formed by the gate metal layer 464 rather than by first contact metal layer 456. As shown in FIG. 6, the device represented by I-V plot 606 exhibits current saturation at about 8 μA at potential differences above about 10 V. I-V plot 608 represents a depletion-mode current source having upper, middle, and lower field plates 438, 436, 434 substantially as shown in FIG. 4. As shown in FIG. 6, the device represented by I-V plot 608 exhibits current saturation at about 4 μA at potential differences above about 5 V. According to FIG. 6, in general, the lower the metal for the field plate is to the 2DEG, the lower the saturation current and the lower the potential difference at which the saturation current is reached.

Figure 7:
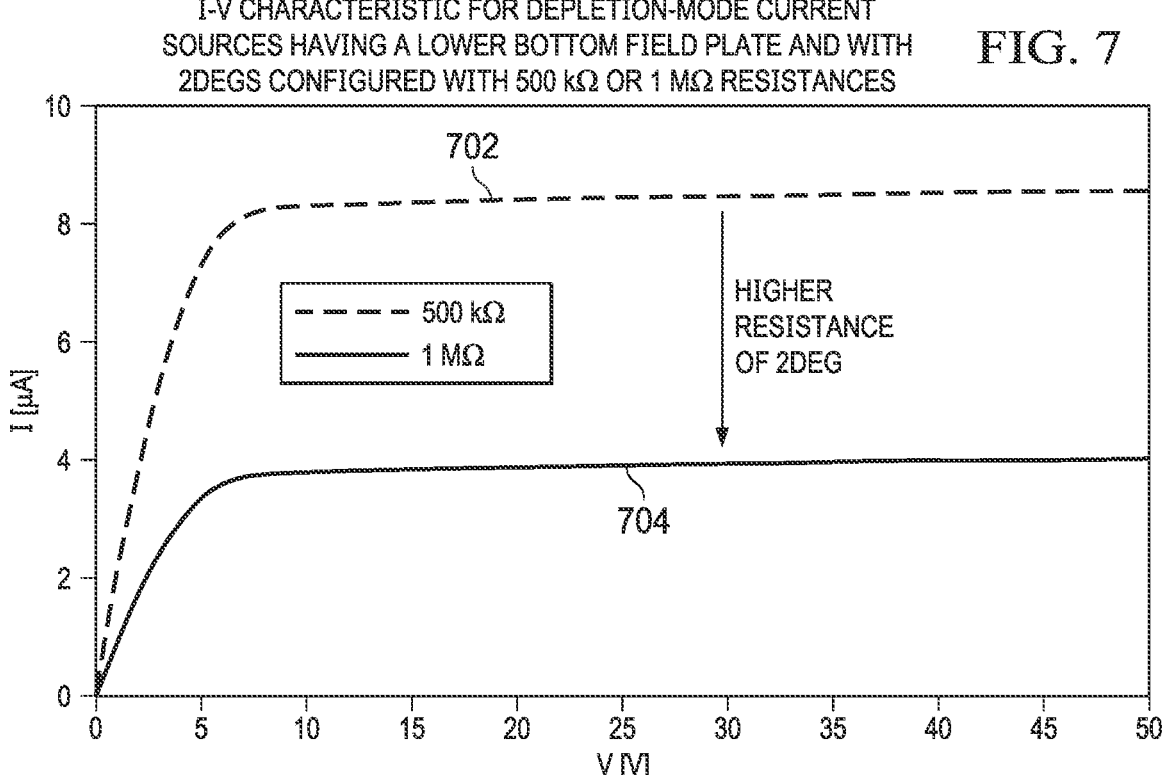
FIG. 7 is a graph of example current-voltage curves for two different 2DEG-based devices, both having field plates, but with varying 2DEG channel resistances.

The graph of FIG. 7 shows I-V plots for two different example current sources fabricated like depletion-mode cur-rent source 426, with varying 2DEG resistances. I-V plot 702 corresponds to a depletion-mode current source having upper, middle, and lower field plates 438, 436, 434 substan-tially as shown in FIG. 4, and with a 2DEG pattern config-ured to provide a resistance of 500 kΩ As shown in FIG. 7, the device represented by I-V plot 702 exhibits current saturation at about 8.5 μA at potential differences above about 10 V. I-V plot 704, which is identical to I-V plot 608 in FIG. 6, corresponds to a depletion-mode current source having upper, middle, and lower field plates 438, 436, 434 substantially as shown in FIG. 4, and with a 2DEG pattern configured to provide a resistance of 1 MΩ. As shown in FIG. 7, the device represented by I-V plot 704 exhibits current saturation at about 4 μA at potential differences above about 5 V. According to FIG. 7, in general, the higher the resistance for which the 2DEG pattern is configured, the lower the saturation current of the depletion-mode current source device.

Figures 8E, 8F:
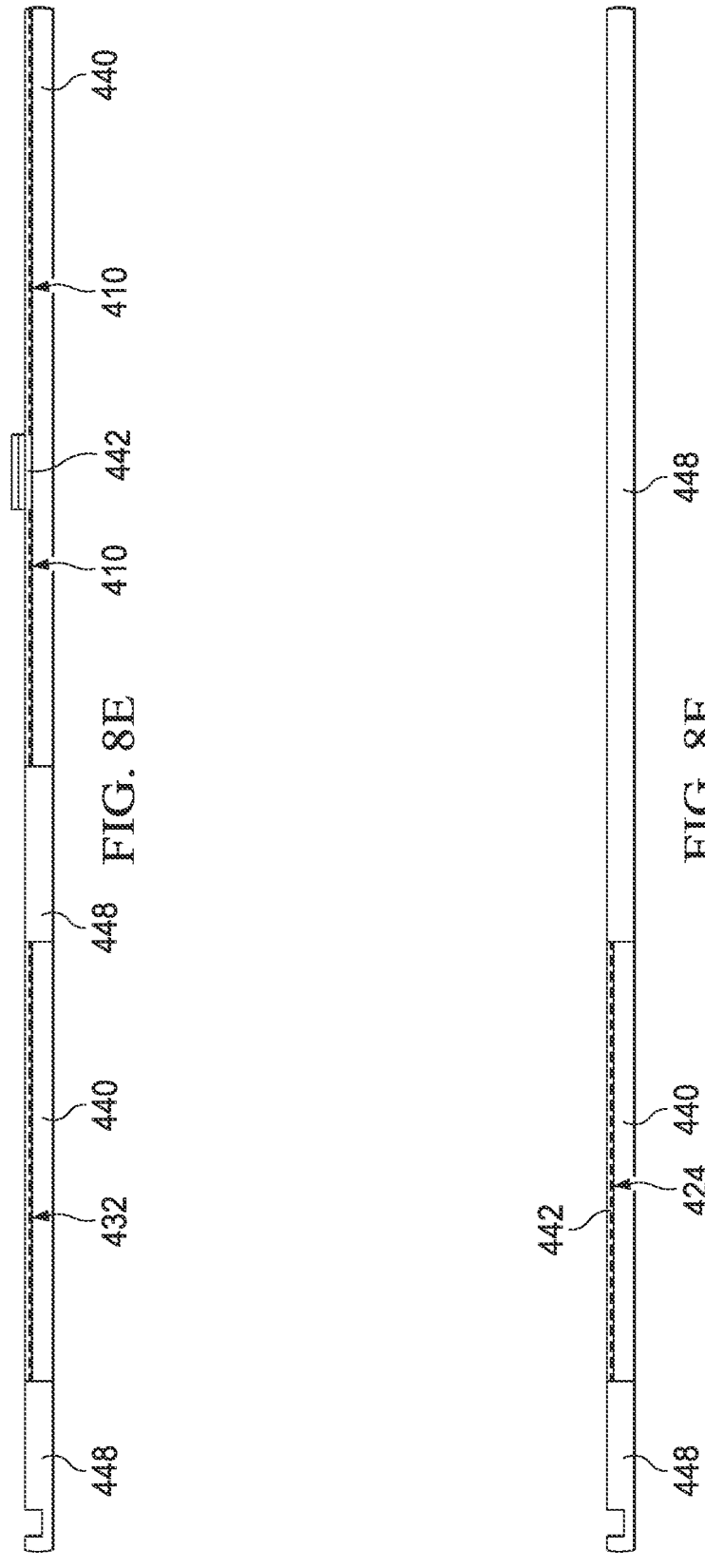
FIGS. 8A-8Z are cross-sectional views showing example fabrication steps leading to the devices of FIGS. 4A and 4B.
Figure 8G:
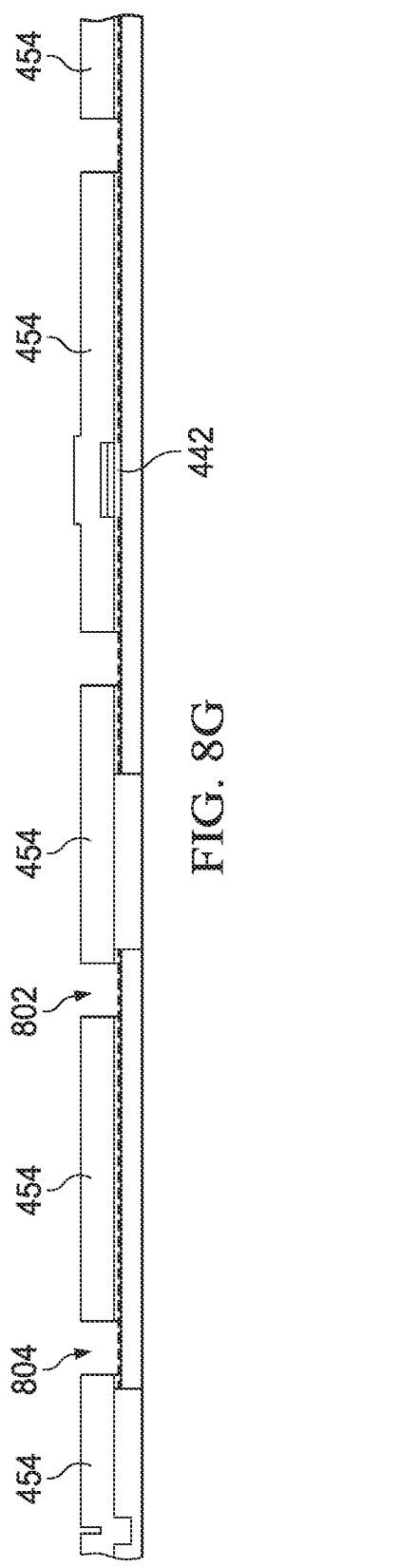
Figure 8H:
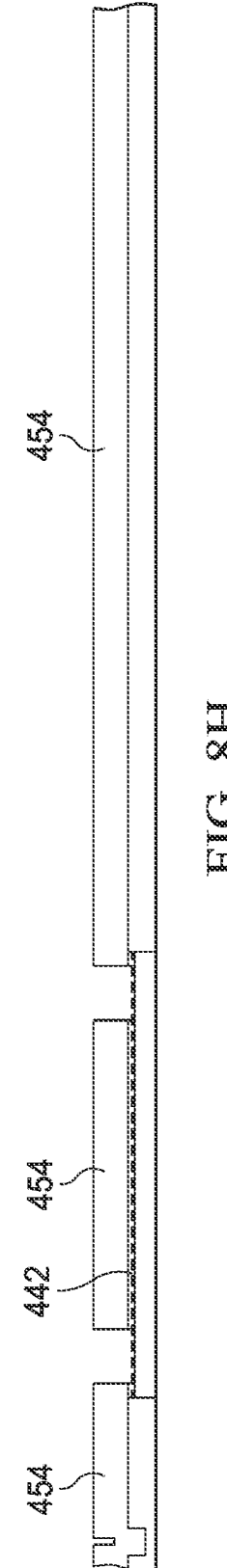
Figures 8I, 8J:
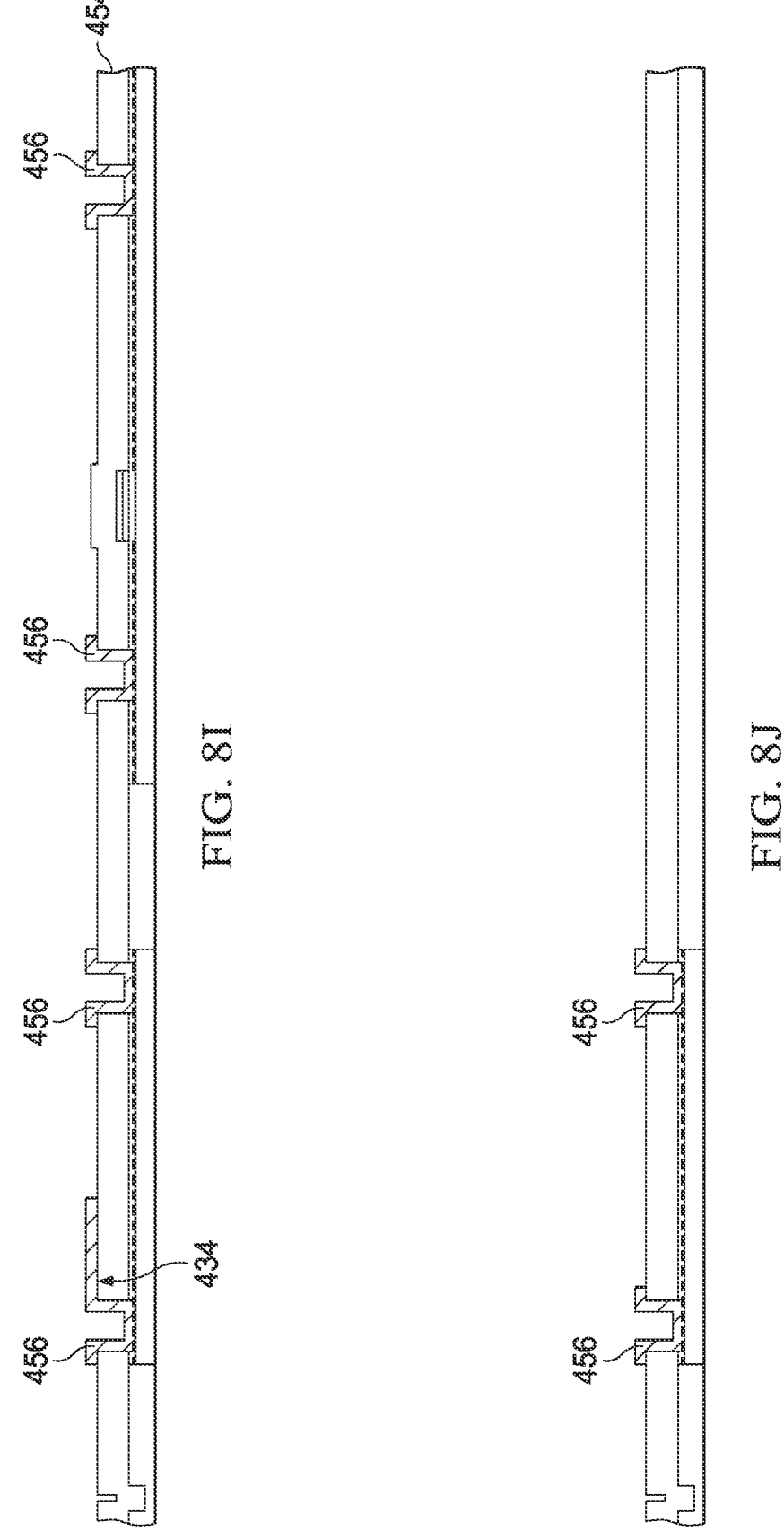
Figures 8K, 8L:
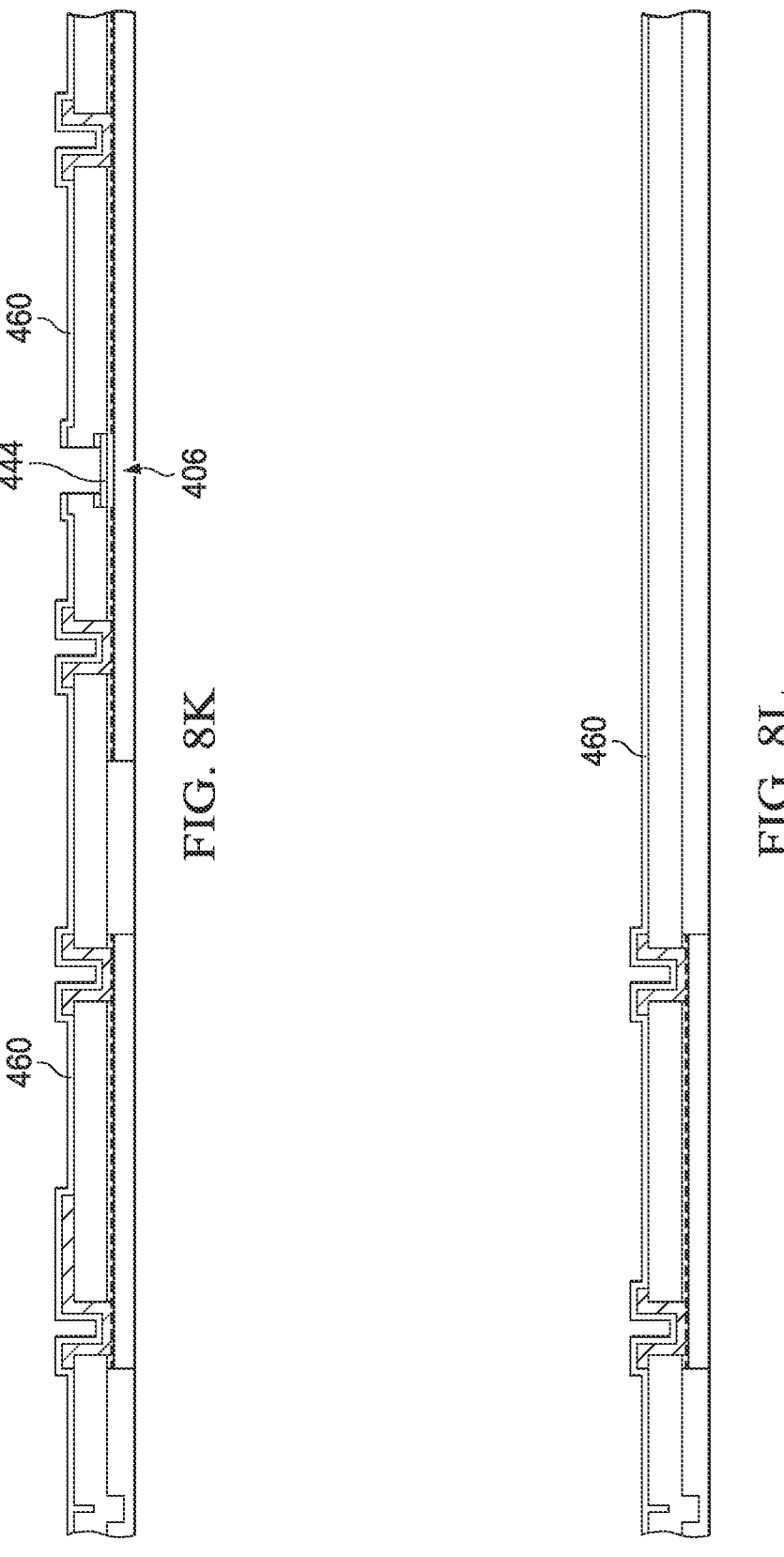
Figures 8M, 8N:
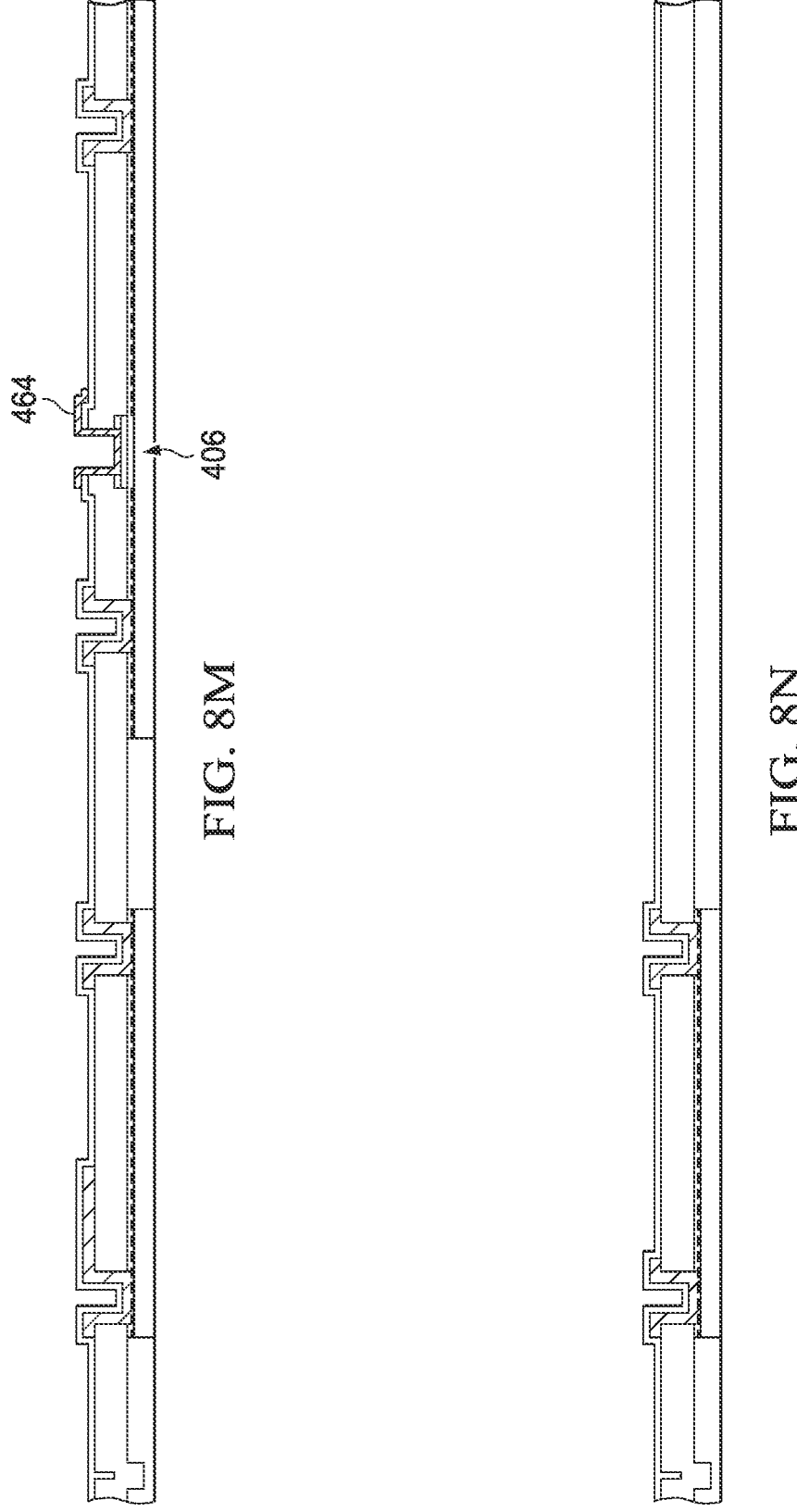
Figures 8Q, 8R:
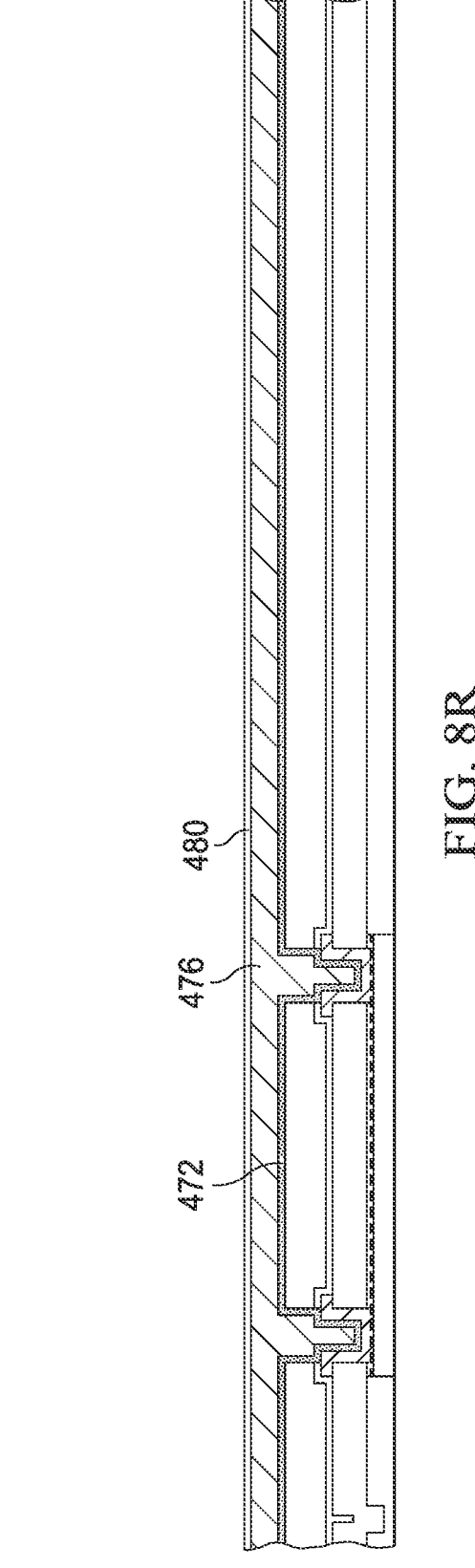
Figures 8S, 8T:
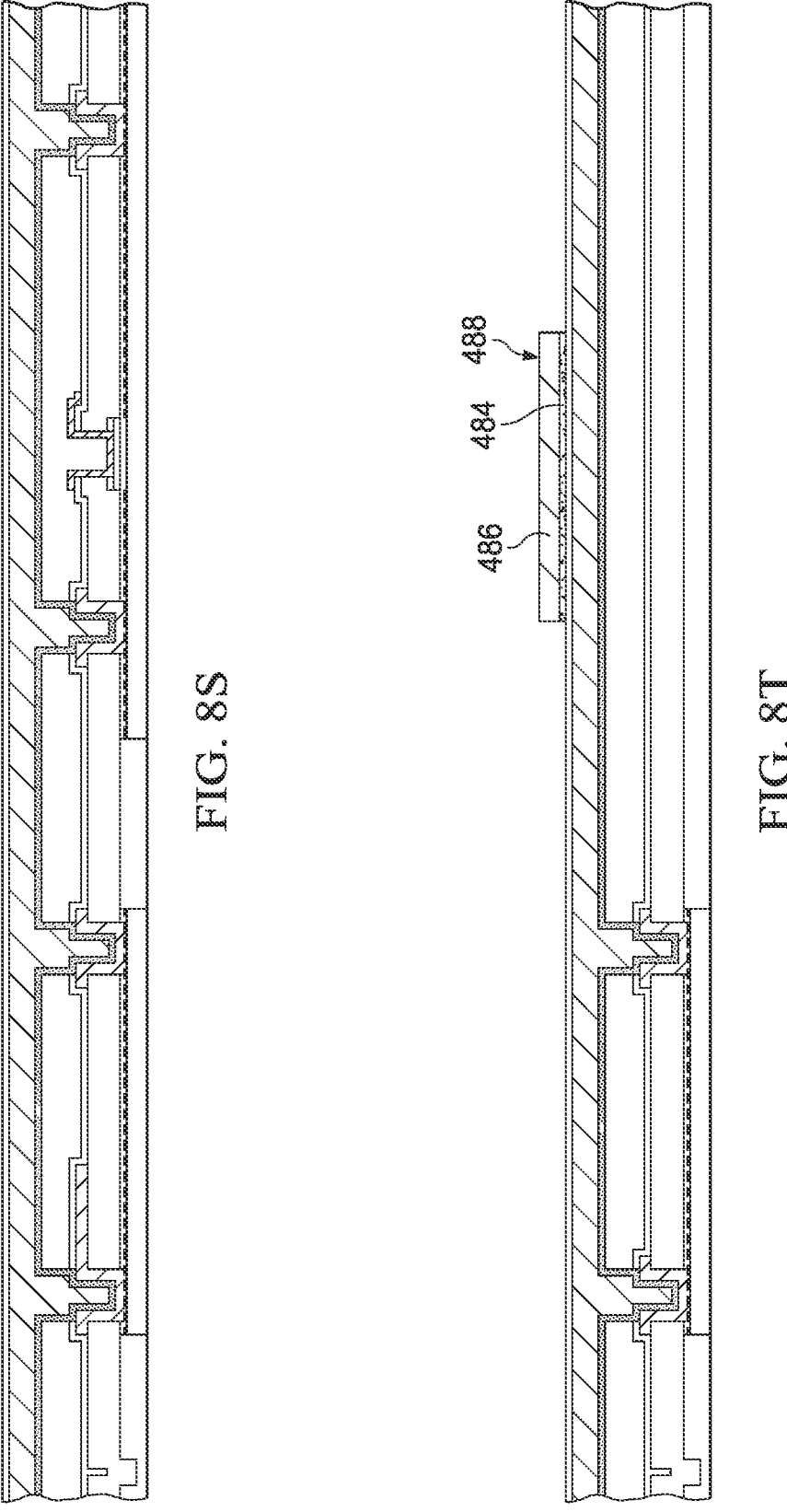
Figure 8U:
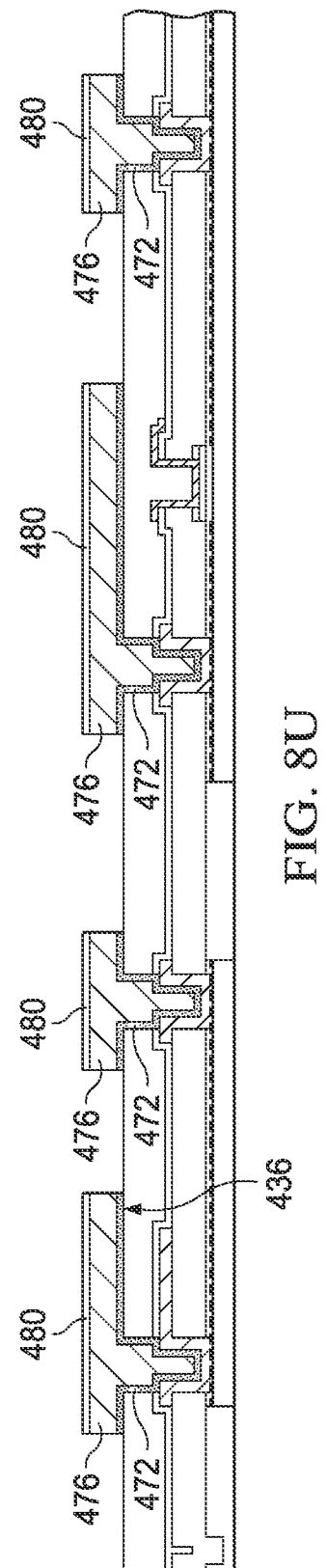
Figure 8V:
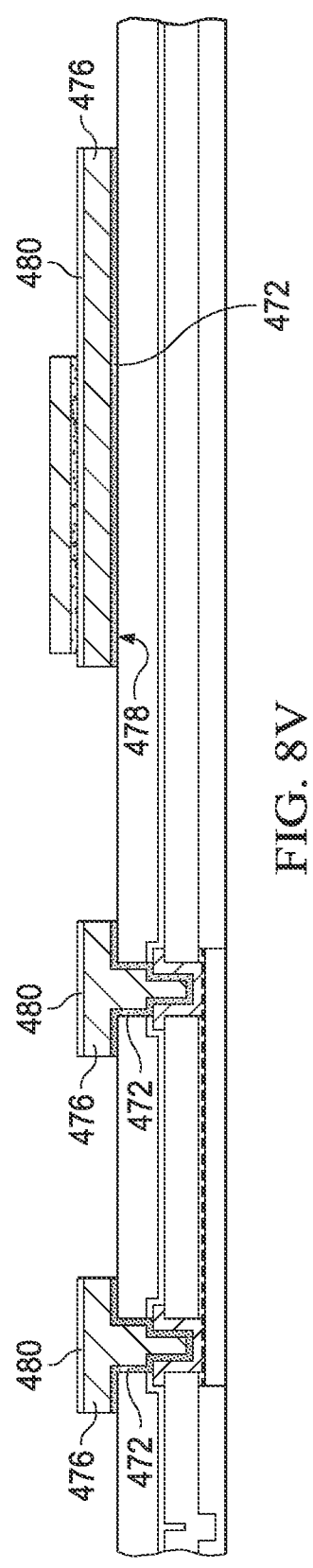
Figures 8W, 8X:
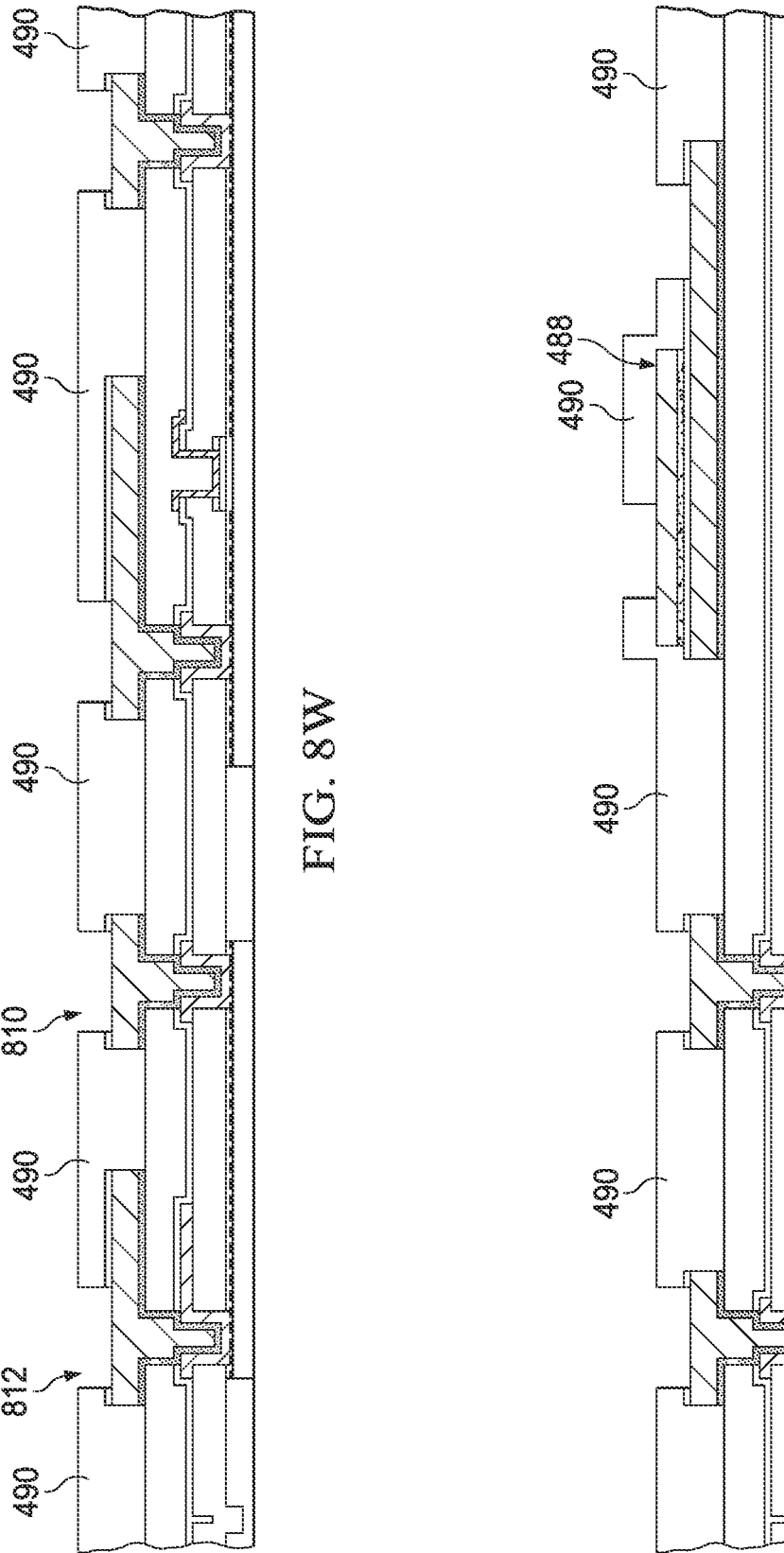
Figures 8Y, 8Z:
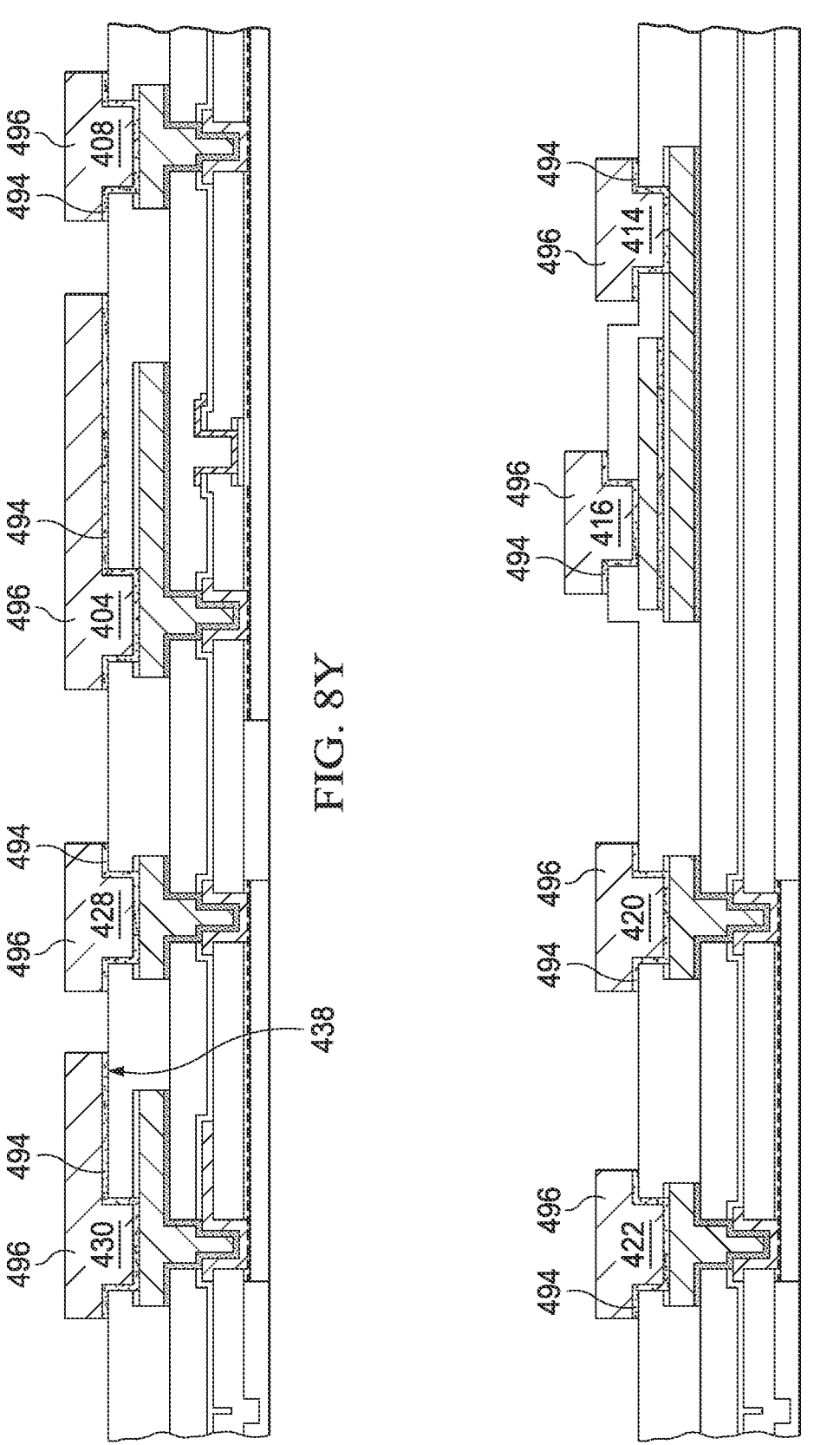

FIGS. 8A-8Z collectively illustrate an example fabrica-tion process by which enhancement-mode FET 402, MIM capacitor 412, 2DEG resistor 418, and depletion-mode cur-rent source 426 of FIGS. 4A-4B can be produced. The example fabrication process uses fourteen mask layers, as set forth in Table 1.

TABLE 1

| | | Mask Layers in Fabrication Process of FIGS. 8A-8Z | |
|---|---|---|
| No. | Mask Layer | Mask Layer Purpose |
| #1 | POLE0 | Alignment marks |
| #2 | PBGT | Enhancement-mode p-GaN gate (p-GaN/SiN stack) |
| #3 | ISO1 | Isolation (Ar implantation) |
| #4 | CONTSD | Source/drain contact and 2DEG resistor head contact |
| #5 | METSD | Source/drain metal and 2DEG resistor head metal |
| #6 | PCONT | Open window to p-GaN contact |
| #7 | METBGT | Create gate metal |
| #8 | CONT | Open window to source/drain contact |
| #9 | CAPD | Create capacitor top plate |
| #10 | MET1 | Create leads, middle field plate, and capacitor bottom plate |
| #11 | VIA1 | Open windows to contacts |
| #12 | MET2 | Create leads, upper field plate, and capacitor bottom plate |
| #13 | TRENCH | Deep etch in scribe area |
| #14 | POR | PO pad opening |

FIGS. 8A and 8B show a 2DEG-supportive epi-structure that can be grown or deposited on substrate (not shown), which can be, e.g., a silicon substrate. A thick buffer layer (also not shown) can be grown or deposited to enable the growth of high-quality material on top of the silicon sub-strate. The buffer layer can consist, e.g., of an aluminum nitride layer and various compositions of AlGaN, or a super-lattice structure starting with aluminum nitride (AlN) and a repeating periodic structure of GaN and AlN or AlGaN and AlN, or a combination of those two.

Above the buffer layer is grown or deposited the 2DEG-supportive epi-structure that includes at least first semicon-ductor layer 440 of, e.g., GaN, and a second semiconductor (barrier) layer 442 of, e.g., AlGaN. The thickness of the AlGaN layer 442 and the proportion of aluminum in the AlGaN layer 442 can be selected to achieve a positive threshold voltage of enhancement-mode FET 402 given the provided selected thickness of the p-type (e.g., p-GaN) layer 444. AlGaN layer 442 can be a single AlGaN layer, or can be a combination of a thin AlN layer and an AlGaN layer, wherein the AlN layer can be below or above the AlGaN layer. In some examples, the AlGaN layer 442 can also be substituted with a layer of aluminum indium gallium nitride (AlInGaN), aluminium indium nitride (AlInN), or MN. The GaN layer 440 can also be aluminum-containing. The epi-structure can be made 2DEG-supportive with a variety of materials having a difference in the composition between the lower layer 440 and the layer 442 above it, in the absence of a p-type layer 444 (e.g., p-GaN) on top.

A doped semiconductor layer 444 of, e.g., p-GaN, p-type indium gallium nitride (InGaN), or a combination of InGaN and MN layers, can be grown or deposited on top of the 2DEG-supportive epi-structure. The doped semiconductor layer 444 can be doped, e.g., with magnesium (Mg) at a dopant concentration of between about $1\times10^{17}$ ions/cm$^3$ and about $1\times10^{20}$ ions/cm$^3$, e.g., between about $1\times10^{19}$ ions/cm$^3$ and about $3\times10^{19}$ ions/cm$^3$. The doped semiconductor layer 444 can have a thickness of, e.g., between about 100 angstroms and 3,000 angstroms, e.g., about 700 angstroms. The p-type doped semiconductor layer 444 depletes the channel and prevents formation of a 2DEG channel wher-ever the doped semiconductor layer 444 is present.

A very thin passivation layer 446 of any dielectric mate-rial, e.g., SiN, can be added to protect the surface. Passiva-tion layer 446 can have a thickness of, e.g., 100 angstroms. Passivation layer 446 can be added by, for example, low pressure chemical vapor deposition (LPCVD). A first pho-
tolithography mask, POLE0, can be applied and an etch can
be performed to create alignment marks, such as mark 452,
for the photolithography tools to align to the wafer.

FIGS. 8C and 8D show the structures of FIGS. 8A and 8B
following application of a second photolithography mask,
PBGT, used to form an enhancement-mode FET gate at
location 406 by removing (e.g., dry etching) the doped layer
444 and the passivation layer 446 everywhere but in the
location 406 of the gate. Consequently, 2DEG channel 447,
as indicated by a broken line in FIGS. 8C and 8D, forms
everywhere the doped layer 444 (e.g., p-GaN) is removed.

FIGS. 8E and 8F show the structures of FIGS. 8C and 8D
following application of a third photolithography mask,
ISO1, used to target a damage implant to isolate devices by
separating connected 2DEG 447 into regions 410, 424, 432.
The damage implant can be used to damage layers 440
and/or 442 in areas where it is not desired that the 2DEG be
present. The damage implant can be, e.g., argon (Ar),
implanted at a surface flux and energy sufficient to create
damage to disable the 2DEG 447 at the damaged areas.
Other ion species that can be used for the damage implant
include magnesium (Mg) and fluorine (F). This damage
process can also be used to pattern the 2DEG channel for
resistor and current source devices 418, 426 as shown in
FIG. 5, by damaging in pattern-defining region 508 outside
serpentine pattern 502 to eliminate the formation of the
2DEG in this region 508. In other examples (not illustrated),
instead of using a damage implant process, a mesa etch can
be performed to etch off the layer 442 and/or layer 440 (e.g.,
AlGaN and GaN layers). Etching off upper layer 442 (e.g.,
AlGaN layer) suffices to cause the 2DEG not to form in the
etched region.

FIGS. 8G and 8H show the structures of FIGS. 8E and 8F
following growth or deposition of a passivation film 454, as
needed to prevent any trap surface effects, application of a
fourth photolithography mask for source and drain contacts,
CONTSD, except at regions where source/drain contacts
408, 404, 2DEG resistor head contacts 420, 422, and current
source head contacts 428, 430 are to be formed, and an etch.
Passivation film 454 can be, e.g., SiN, SiO₂, silicon oxyni-
tride (SiON), AlN, a combination of any of these dielectrics,
or any dielectric film that can potentially passivate surface
traps, and also prevents leakage through the film 454 after
placement of terminals 404, 408, 420, 422, 428, 430. As an
example, passivation film 454 can be a nitride deposited
using LPCVD to a thickness of about 1,525 angstroms.
Source and drain contact mask CONTSD can be patterned to
make the opening windows, e.g., windows 802 and 804, at
locations where ohmic contacts to the 2DEG will subse-
quently be formed. In the cross sections of FIGS. 8G and 8H,
the etch process is shown to have etched off portions of layer
442 (e.g., AlGaN), but depending on the metal process used
to form an ohmic contact, in some examples layer 442 can
be retained and only passivation layer 454 (e.g., SiN) is
etched away to subsequently form the ohmic contacts. In
still other examples, ohmic contact is made with the 2DEG
by etching completely through layer 442. In some examples,
the resistance of 2DEG resistor 418 and current source 426
can be adjusted by selection of ohmic contact formation
parameters. In some examples, depletion-mode devices such
as current source 426 use only a partial etch into layer 442
for ohmic contacts and enhancement-mode devices such as
FET 402 etch only to the edge of layer 442, without having
to etch into layer 442, for ohmic contacts.

FIGS. 8I and 8J show the structures of FIGS. 8G and 8H
following metal deposition used to form the metal layers 456, application of a fifth photolithography mask, METSD,
an etch, and an ohmic anneal. Metal layers 456 provide
metal contacts to the source 404 and drain 408 of the
enhancement-mode transistor 402, the 2DEG resistor heads
420, 422, and current source heads 428, 430 and the lower
field plate 434 of the current source 426. First contact metal
layer 456, which forms part of the ohmic contacts 404, 408,
420, 422, 428, 430 to the 2DEG 410, 424, 432, can be a
titanium- and aluminum-based contact. For example, first
contact metal layer 456 can be a multi-layer including a
layer of titanium (Ti) having a thickness of, e.g., between
about 300 angstroms and about 500 angstroms, e.g., about
400 angstroms, a layer of an aluminum-copper alloy (AlCu)
above the layer of Ti having a thickness of, e.g., between
about 750 angstroms and about 1,250 angstroms, e.g., about
1,000 angstroms, a layer of titanium nitride (TiN) above the
layer of AlCu having a thickness of, e.g., between about 400
angstroms and about 600 angstroms, e.g., about 500 ang-
stroms, and a layer of TiW having a thickness of, e.g., about
1,000 angstroms. First metal contact layer 456 can be
formed, in other examples, of any of a number of other
metals, including TiAl, tantalum (Ta), nickel (Ni), or gold
(Au). In some examples, the lower surface of the lower field
plate 434 can be between about 1,500 angstroms and about
1,700 angstroms above the 2DEG channel 424.

The fifth photolithography mask and subsequent etch can
remove ohmic contact layers 456 except where desired to
provide contacts to the 2DEG and field plate 434. The etch
can be followed by ohmic anneal.

FIGS. 8K and 8L show the structures of FIGS. 8I and 8J
following growth or deposition of second dielectric layer
460, application of a sixth photolithography mask, PCONT,
an etch, and an anneal. Second dielectric layer 460 can be,
e.g., a thin UV nitride stack deposited using PECVD, e.g., to
a thickness of about 740 angstroms. Second dielectric layer
460 can be, e.g., SiN, or, in other examples, can be SiO₂,
SiON, aluminum oxide (Al₂O₃), or a combination of these.
Second dielectric layer 460 prevents shorting of the ohmic
contact layers 456 to a subsequently deposited metal layer.
The sixth photolithography mask can permit etching down
through to the FET gate doped semiconductor (e.g., p-GaN)
layer 444, creating a window to allow contact with doped
semiconductor layer 444 by gate metal layer 464 in a
subsequent metal layer deposition.

After opening the contact at the location 406 of the FET
gate, an activation anneal can be performed. In examples
that use p-GaN as the FET gate doped semiconductor layer
444, the p-GaN can become inactive depending on the film
deposition condition of the SiN films 454, 460. Once the
window to the p-GaN is opened, the activation anneal is
performed to re-activate the p-GaN. The term "activation" is
used differently here than it is with respect to doped-silicon-
based device fabrication processes, wherein an activation
anneal is used to ensure an activated implant species mate-
rial is incorporated into the crystal structure of the semicon-
ductor. Here, the magnesium in the p-GaN is already in the
crystal structure of the p-GaN layer 444, but there may be
some hydrogen complexes in the p-GaN layer 444 that can
make the p-GaN layer 444 electrically inactive. Rather than
forming holes that are necessary to be conductive p-GaN
material, the presence of hydrogen from the growth of the
p-GaN layer 444, or from the depositions of the SiN layers
454, 460, can inactivate the p-GaN layer 444. Thus, the
activation anneal can be performed to break down the
hydrogen-magnesium complexes.

FIGS. 8M and 8N show the structures of FIGS. 8K and 8L
following, gate metal layer 464 can be Ti, TiN, Ni, or Al.

Gate metal layer 464 can in some examples be a multi-stack consisting of different materials. The seventh photolithography mask and accompanying etch removes the gate metal layer 464 except for over the location 406 of the FET gate.

FIGS. 8O and 8P show the structures of FIGS. 8K and 8L following growth or deposition of third dielectric layer 468, application of an eighth photolithography mask, CONT, and an etch. Third dielectric layer 468 can be, e.g., a nitride film deposited using PECVD. Third dielectric layer 468 can be, e.g., p-SiN deposited to a thickness of about 1,700 angstroms. The eighth photolithography mask and accompanying etch can be used to open windows, e.g., windows 806 and 808, through the third dielectric layer 468 to the previously deposited ohmic contacts to the source 404 and drain 408 of the enhancement-mode transistor 402, the 2DEG resistor heads 420, 422, and current source heads 428, 430 (as shown in FIGS. 4A and 4B). Conductive contacts to the ohmic contacts may subsequently be formed in the locations of these windows. Although not depicted in FIG. 8O, the FET gate 464 can also be opened by the same etch to a contact at regions where FET gate 464 should be connected at a finger edge.

FIGS. 8Q and 8R show the structures of FIGS. 8O and 8P following deposition of first glue layer 472, deposition of second contact metal layer 476, and growth or deposition of fourth dielectric layer 480. First glue layer 472 can be, e.g., TiW deposited to a thickness of about 1100 angstroms. Second contact metal layer 476 can be, e.g., AlCu deposited to a thickness of about 3,000 angstroms. Second metal contact layer 476 can, in other examples, be copper (Cu) or Au. A very thin layer of TiN (not shown) can be placed on top of the second contact metal layer 476, e.g., to a thickness of about 300 angstroms. In some examples, this TiN layer may be omitted, or may disappear due to subsequent depositions of, e.g., fourth dielectric layer 480 or etches, as depicted, e.g., in FIGS. 8U and 8V. A thin fourth dielectric layer 480 can be grown or deposited on top of metal layers 472, 476 to form the dielectric for MIM capacitor 412. This fourth dielectric layer 480 can be, e.g., a nitride layer deposited using PECVD to a thickness of about 740 angstroms. In some examples, the lower surface of the middle field plate 436 can be between about 3,900 angstroms and about 4,200 angstroms above the 2DEG channel 424.

FIGS. 8S and 8T show the structures of FIGS. 8Q and 8R following deposition of second glue layer 484, deposition of third contact metal layer 486, application of a ninth photolithography mask, CAPD, and an etch. Second glue layer 484 can be, e.g., TiW deposited to a thickness of about 500 angstroms. Third contact metal layer 486 can be, e.g., AlCu deposited to a thickness of about 1,000 angstroms. Third metal contact layer 486 can, in other examples, be Cu or Au. Second glue layer 484 and third contact metal layer 486 together form the upper plate 488 of MIM capacitor 412. Another very thin layer of TiN (not shown) can be placed on top of the third contact metal layer 486, e.g., to a thickness of about 300 angstroms. In some examples, this TiN layer may be omitted, or may disappear due to subsequent etches, as depicted, e.g., in FIGS. 8U and 8V. The ninth photolithography mask is used to pattern and etch the metal layers 484, 486 to form the capacitor top plate 488.

FIGS. 8U and 8V show the structures of FIGS. 8S and 8T following application of a tenth photolithography mask, MET1, and an etch. Metal layers 472, 476 and fourth dielectric layer 480 are selectively etched away to form the middle field plate 436 of the current source 426, lower plate 478 of capacitor 412, and to continue ohmic contacts for the FET 402, resistor 418, and current source 426.

FIGS. 8W and 8X show the structures of FIGS. 8U and 8V following growth or deposition of fifth dielectric layer 490, application of an eleventh photolithography mask, VIA1, and an etch. Fifth dielectric layer 490 can be, for example, a nitride deposited using PECVD to a thickness of about 5,500 angstroms. In areas where upper capacitor plate 488 is present, fifth dielectric layer 490 goes over upper capacitor plate 488. The eleventh photolithography mask can be used to pattern and open windows, e.g., windows 810 and 812, to the contacts to the metal layers, where the contacts may subsequently be vertically extended up through fifth dielectric layer 490.

FIGS. 8Y and 8Z show the structures of FIGS. 8W and 8X following deposition of third glue layer 494, deposition of fourth contact metal layer 496, application of a twelfth photolithography mask, MET2, and an etch. Third glue layer 494 can be, e.g., TiW deposited to a thickness of about 3,000 angstroms. Fourth contact metal layer 496 can be, e.g., AlCu deposited to a thickness of about 30.4 kiloangstroms. Fourth metal contact layer 496 can, in other examples, be Cu or Au. Third glue layer 494 and fourth contact metal layer 496 together form the upper field plate 438 of current source 426. Another very thin layer of TiN (not shown) can be placed on top of the third contact metal layer 486, e.g., to a thickness of about 300 angstroms. In some examples, this TiN layer may be omitted, or may disappear due to subsequent depositions or etches. The twelfth photolithography mask is used to pattern and etch the metal layers 494, 496 to form the terminals 404, 408, 420, 422, 428, 430 and the upper field plate 438. In some examples, the lower surface of the upper field plate 438 can be between about 9 kiloangstroms and about 10 kiloangstroms, e.g., between about 9,450 angstroms and about 9,650 angstroms, above the 2DEG channel 424.

FIGS. 4A and 4B show the structures of FIGS. 8Y and 8Z following growth or deposition of sixth dielectric layer 498. Sixth dielectric layer 498 can be a PO film, which can include an oxide (e.g., $SiO_2$), a nitride (e.g., SiN), an oxynitride (e.g., SiON), or a combination of these. As an example, sixth dielectric layer 498 can include a lower oxide layer and an upper nitride film layer. As examples, the lower oxide layer can be layer of $SiO_2$ produced using TEOS deposited using PECVD to a thickness of about 10 kiloangstroms, and the upper nitride film layer can be SiN deposited using PECVD to a thickness of about 20 kiloangstroms. In some examples, deposition of the lower oxide layer of sixth dielectric layer 498 can be followed by a sinter, and by application of a thirteenth photolithography mask, TRENCH, and an etch, to form trenches for a metal wire layer to connect devices. In some examples, deposition of the upper nitride film layer of sixth dielectric layer 498 can be followed by application of a fourteenth photolithography mask, POR, and an etch, to form pad openings in the PO, opening windows to access the contacts to terminals 404, 408, 420, 422, 428, 430. This can then be followed by a long sinter at, e.g., about 400° C. for about 6 hours plus 6 hours. In other examples, not illustrated, the PO may be omitted, and the devices 402, 412, 418, 426 may be directly coated with one or more polyimide coatings or other polymer-based films. A summary of example materials and thicknesses for the various layers shown in FIGS. 4A and 4B is given in Table 2.

TABLE 2

Layers in Devices of FIGS. 4A-4B

| No. | Example Layer Material | Example Layer Thickness Range (angstroms) |
|---|---|---|
| 440 | GaN | |
| 444 | AlGaN | 140-200 (e.g., 170) |
| 454 | p-GaN | 590-810 (e.g., 700) |
| 454 | SiN | 1,290-1,760 (e.g., 1,525) |
| 456 | Ti | 340-460 (e.g., 400) |
| | AlCu | 850-1,150 (e.g., 1,000) |
| | TiN | 420-580 (e.g., 500) |
| | TiW | 850-1,150 (e.g., 1,000) |
| 460 | SiN | 620-860 (e.g., 740) |
| 464 | TiW | 1,530-2,070 (e.g., 1,800) |
| 468 | p-SiN | 1,440-1,960 (e.g., 1,700) |
| 472 | TiW | 930-1,270 (e.g., 1,100) |
| 476 | AlCu | 2,550-3,450 (e.g., 3,000) |
| 480 | SiN | 620-860 (e.g., 740) |
| 484 | TiW | 420-580 (e.g., 500) |
| 486 | AlCu | 850-1,150 (e.g., 1,000) |
| 490 | SiN | 4,670-6,330 (e.g., 5,500) |
| 494 | TiW | 2,550-3,450 (e.g., 3,000) |
| 496 | AlCu | 25,840-34,960 (e.g., 30,400) |
| 498 | $SiO_2$ | 8,500-11,500 (e.g., 10,000) |
| | SiN | 17,000-23,000 (e.g., 20,000) |

The flow chart of FIG. 9 illustrates an example method 900 of fabricating a depletion-mode current source on an IC, such as current source 426 shown in FIG. 4A. A first semiconductor layer and a second semiconductor layer are grown or deposited 902 over a substrate. The first semiconductor layer can correspond, for example, to layer 440 of FIGS. 4A and 8A, and can be, e.g., GaN. The second semiconductor layer, which is over the first semiconductor layer, can correspond, for example, to layer 442 of FIGS. 4A and 8A, and can be, e.g., AlGaN. The first and second semiconductor layers are configured to support a 2DEG or 2DHG. One or both of the first and/or second semiconductor layers are implanted (e.g., with a damage implant) or etched (e.g., with a mesa etch) 904 to pattern the 2DEG or 2DHG channel over an area of the channel. Example isolation damage implantation is shown in FIG. 8E to create isolation regions 448. The pattern can be, e.g., a serpentine pattern as shown of example channel pattern 502 in FIG. 5.

A first dielectric layer is grown or deposited 906 over the second semiconductor layer. The first dielectric layer can correspond to layer 454 of FIGS. 4A and 8G and can be, e.g., SiN. The first dielectric layer is photolithographically etched 908 to open first and second ohmic contact windows to the 2DEG or 2DHG channel, e.g., at respective ends of the channel. Example windows 802 and 805 are shown in FIG. 8G. One or more ohmic contact layers are deposited and etched 910 to form, at the locations of the ohmic contact windows, first and second ohmic contacts, e.g., to respective ends of the 2DEG or 2DHG channel. At least one of the first and second ohmic contacts includes a conductive electrode (e.g. field plate), e.g., lower field plate 434 in FIG. 4A, above the first dielectric layer. In some examples, this conductive electrode can extend over at least a portion, and in some examples the entirety, of the resistively patterned area of the 2DEG or 2DHG channel. As an example, a lower surface of the conductive electrode can be between about 1,500 angstroms and about 1,700 angstroms above the 2DEG or 2DHG channel. The conductive electrode can be the sole field plate fabricated in the current source device or can be a lower field plate in a current source device structure having multiple field plates if method 900 is continued to fabricate one or more additional field plates.

The method 900 of FIG. 9 can continue with growth or deposition 912 of a second dielectric layer over the first dielectric layer, the first and second ohmic contacts, and the second conductive electrode, which can be a middle field plate. This second dielectric layer can be, for example, either dielectric layer 460 or dielectric layer 468 shown in FIGS. 4A, 8K, and 8O, or a combination of the two, and can be, e.g., SiN or p-SiN, or a combination of the two. The second dielectric layer is etched 914 to open first and second conductive contact windows, e.g., windows 806, 808 in FIG. 8O, through the second dielectric layer to the first and second ohmic contacts. A metal layer is deposited and etched 916 to form respective first and second conductive contacts to the first and second ohmic contacts and the second conductive electrode extending from one of the first or second conductive contacts over the lower conductive electrode above the second dielectric layer. The deposition can be as shown in FIG. 8Q. The etching can be as shown in FIG. 8U. The second field plate can be, e.g., middle field plate 436 shown in FIG. 4A. The method 900 can end at this point or can continue to create a third, upper field plate.

The method 900 of FIG. 9 can continue with growth or deposition 918 of a third dielectric layer over the second dielectric layer, the first and second conductive contacts, and the second conductive electrode. The third dielectric layer can be, e.g., layer 590 as shown in FIGS. 4A and 8W. The third dielectric layer is etched 920 to open first and second windows, e.g., windows 810 and 812 in FIG. 8W, through the third dielectric layer to the first and second conductive contacts. An upper metal layer is deposited and etched 922 to extend the first and second conductive contacts up through the first and second windows through the third dielectric layer and to form a third conductive electrode (e.g., an upper field plate) extending from one of the first or second conductive contacts over the middle field plate above the third dielectric layer. The result of the deposition and etching can be as shown in FIG. 8Y, and can result in current source terminals 428, 430 and upper field plate 438. The method 900 can end at this point or can continue to add a PO dielectric layer, wiring layers, and/or additional field plates (not shown in FIG. 9). The method 900 can also include various other etches, anneals, and/or sinters (also not shown in FIG. 9). The method 900 can also include additional metal layers to create additional, higher conductive electrodes (e.g., field plates). The method 900 can also include providing wiring on one or more metal layers to couple to terminals of the depletion-mode current source, such as are shown in FIGS. 10 through 15. For example, the method 900 can include providing first wiring to the first ohmic contact and second wiring to the second ohmic contact to provide the depletion-mode current source as a two-terminal device.

The devices of FIGS. 4A and 4B can be wired together using wiring layers to form a start-up circuit like start-up circuit 300 of FIG. 3A, with depletion-mode current source 426 of FIG. 4A used to implement pre-charge circuit 302 of FIG. 3A, enhancement-mode FET 402 of FIG. 4A used to implement transistors $Q_1$ and $Q_2$ of FIG. 3A, MIM capacitor 412 of FIG. 4B used to implement capacitor $C_1$ of FIG. 3A, and 2DEG resistor 418 of FIG. 4B used to implement current-limiting resistor $R_{LIM}$ of FIG. 3A. The drain terminal 408 of FET $Q_1$ can be coupled by wiring in one or more wiring layers (not shown) to the positive terminal 428 of the current source, the coupling forming an electrical node corresponding to node $V_{SW}$ in FIG. 3A. The gate of FET $Q_1$ can be coupled to the negative terminal 430 of the current source, the coupling forming an electrical node corresponding to node $V_{GS1}$ in FIG. 3A. First (e.g., positive) terminal 414 of capacitor $C_1$ can similarly be coupled to node $V_{GS1}$. Second (e.g., negative) terminal 416 of capacitor $C_1$ can be coupled to second terminal 422 of 2DEG resistor RUM. First terminal 420 of 2DEG resistor $R_{LIM}$ can be coupled to the drain terminal 404 of FET $Q_1$ at an electrical node corresponding to node $V_{S1}$ in FIG. 3A. FET $Q_2$ of FIG. 3A can be fabricated on the same die using the same process used to make FET $Q_1$ and can be connected using wiring layers in similar fashion as shown according to the diagram of FIG. 3A, with the drain terminal of FET $Q_2$ coupled to the negative terminal 430 of the current source and to the gate of FET $Q_1$ at node $V_{GS1}$, with the source terminal of FET $Q_2$ coupled to terminal 422 of 2DEG resistor $R_{LIM}$ and to the second terminal 416 of capacitor $C_1$ at node $V_{DD}$, and with the gate of FET $Q_2$ coupled to the source terminal 404 of the FET $Q_1$ and to terminal 420 of 2DEG resistor $R_{LIM}$ at node $V_{S1}$.

The process shown in FIGS. 8A-8Z and 4A-4B permits fabrication, on a single substrate, of depletion-mode current source 426 along with high-voltage p-GaN FET 402, 2DEG resistor 418, and MIM nitride capacitor 412, and construction of a start-up circuit using depletion-mode current source 426 as a pre-charge circuit, without requiring different masks or materials to form the depletion-mode current source 426 and the high-voltage p-GaN FET 402. The 2DEG resistor 418 does not require using a thin metal film like SiChrome (SiCr) or NiChrome (NiCR) as the resistive element. Lower field plating (spatially closer to 2DEG 432) in depletion-mode current source 426 results in a lower saturation current of the current source 426, at about 5 μA in some examples, no break up to 1,000 V over a temperature range of between about −40° C. and 125° C. A lower saturation current can be expected of the current source 426 with higher temperature. In some examples, upper field plate 438 can be omitted from depletion-mode current source 426. In some examples, middle field plate 436 and upper field plate 438 can be omitted from depletion-mode current source 426. The closeness of the lowest field plate (e.g., field plate 434) to the channel of the 2DEG 432 can be determined by the current requirements of the start-up circuit 300. The width of the 2DEG current source 426 can also be adjusted to tune the current density out of the current source 426, which parameters can have an approximately linear relationship with each other.

In contrast to the coverage, in a top-down view, that the field plates 434, 436, 438 of depletion-mode current source 426 provide above the channel of the 2DEG 432, the metal layers of 2DEG resistor 418 do not extend over the resistively patterned area of the 2DEG channel. The coverage of a field plate in current source 426 can be such that the potential difference between the lower-voltage field plate and the highest-voltage portion of the patterned 2DEG channel below the field plate is greater than the pinch-off voltage of a capacitor formed using the field plate over the 2DEG channel. The coverage extension of a field plate in current source 426 can be such that pinch-off occurs before the intrinsic saturation of the semiconductive 2DEG channel. As an example, if the pinch-off voltage is 20 V, the field plate coverage (in a top-down view) can be such that the field plate length covers more than the length required to drop 20 V across the patterned 2DEG channel, and if the field plate coverage extension is shorter than the patterned channel distance required to drop 20 V, the clamping effect and resultant current saturation will be weak or not observed. The width (in the left-right dimension) of the metal layers of 2DEG resistor 418 is exaggerated in FIG. 4B for the purposes of illustrating that the design rule for the upper metal layer (including layer 494) is wider than for the lower metal layer (including layer 472) in resistor 418. FIG. 4B should not be construed as showing field plates in resistor 418 or as showing metal layers extending over the resistively patterned area of the 2DEG channel in resistor 418.

Figure 10:
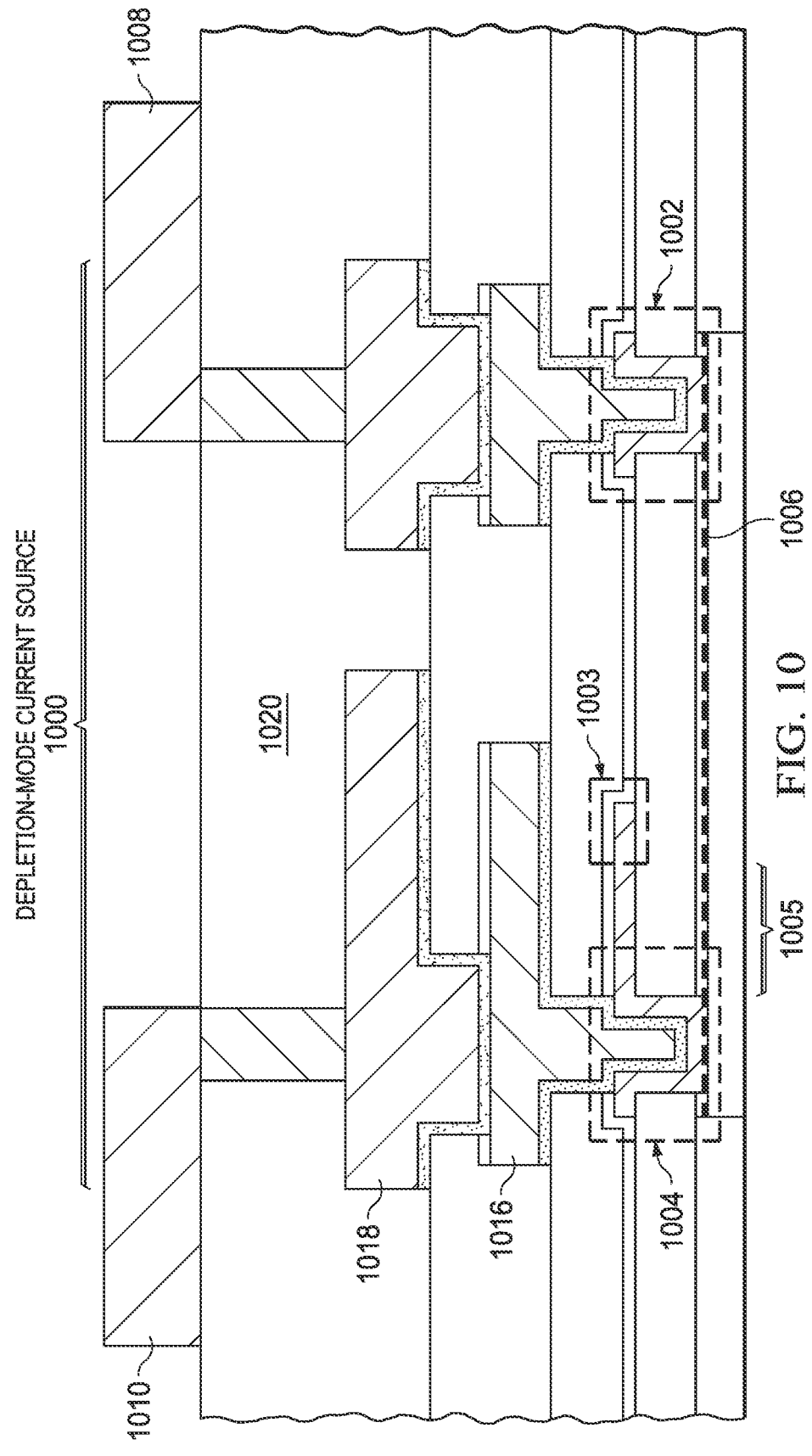
FIG. 10 is a cross-sectional view of the depletion-mode current source of FIG. 4A

FIG. 10 shows an example depletion-mode current source 1000, which can correspond to depletion-mode current source 426 in FIG. 4A, having wiring 1008, 1010 fabricated to conductively couple the terminals of depletion-mode current source 1000. A drain region 1002 in FIG. 10 is conductively coupled to wire 1008 via what corresponds to first metal terminal 428 in FIG. 4A. A source region 1004 in FIG. 10 is conductively coupled to wire 1010 via what corresponds to second metal terminal 430 in FIG. 4A. The drain region 1002 and the source region 1004 are electrically coupled via the resistive 2DEG channel 1006, which, as noted above, can be a 2DHG channel in some examples. Field plates 1016, 1018 in FIG. 10 can correspond to field plates 436, 438 in FIG. 4A, respectively. In some examples, upper dielectric layer 1020, corresponding to sixth dielectric layer 498 in FIG. 4A, can be opened to provide the conductive coupling of the regions 1002, 1004 to the wires 1008, 1010, and the wiring 1008, 1010 can be placed on an additional metal layer. In other examples (not illustrated), the wiring 1008, 1010 can be provided on one of the metal layers already present in the current source device 1000, such as the second contact metal layer 476 used to fabricate field plate 1016, or the fourth contact metal layer 496 used to fabricate field plate 1018. For example, such wiring could be located in front of or behind the drawing plane of FIG. 10.

Depletion-mode current source 1000 of FIG. 10 is thus a two-terminal device. As an example, in the example start-up circuit 300 of FIG. 3A, where depletion-mode current source 1000 is used as part or all of pre-charge circuit 302, wire 1008 can be coupled to switch voltage node $V_{SW}$ and wire 1010 can be coupled to node $V_{GS1}$. Depletion-mode current source 1000 acts as current source to provide a current at about $I = V_{th}/R_{source}$, where $V_{th}$ is the threshold voltage of the depletion-mode current source 1000 and $R_{source}$ is the source degeneration resistance of the 2DEG or 2DHG channel 1006 between the drain and source regions 1002, 1004, with only a very weak dependence on the voltage applied across the depletion-mode current source 1000. The source degeneration resistance can be provided chiefly by resistive patterning of the 2DEG or 2DHG channel 1006 in the region labeled 1005. That is, in such examples, only within region 1005 of FIG. 10 is the 2DEG or 2DHG channel 1006 resistively patterned as in the area 512 in FIG. 5. FIG. 10 is not necessarily to scale and region 1005 may in practice be much longer, compared to other illustrated features, than is shown in FIG. 10 and the related drawings. The higher-level field plates 1016, 1018 can be provided to achieve a desired voltage rating of the depletion-mode current source 1000 (e.g., 650 V). A distal end 1003 of a lowest field plate can be considered as an active gate region of the field plate in that only this distal end 1003 has an influence on the depletion of the channel 1006. The portion of the channel 1006 underlying the active gate region 1003 can correspond, for example, to region 510 in FIG. 5, which area of the channel is not serpentine patterned.

In an example operation of the example depletion-mode current source 1000 of FIG. 10, if drain wire 1008 is at an electrical potential of about 400 V, and source wire 1010 is at an electrical potential of about 5 V, then the potential of the channel 1006 at the location of the drain region 1002 will likewise be at about 400 V, and the potential of the channel 1006 at the location of the source region 1104 will likewise be at about 5 V. The channel 1106, which is conductive, will carry current flowing in the direction from the drain region 1102 to the source region 1004. An active gate region 1003, which is conductively coupled to the source region 1004 and will thus be about equipotential with the source region 1004, will have a negative potential compared to the potential at the region of the channel 1006 underlying the active gate region 1003. The channel 1006 at this point under the active gate region 1003 may have experienced a potential drop of, for example, about 95 V from the point under the drain region 1002, such that the potential of the channel 1006 underneath the active gate region 1003 will be at about 305 V, for example. This about 300 V potential difference between the active gate region 1003 (at about 5 V) and the underlying region of the channel 1006 (at about 305 V) will create an electric field between the underlying area of the channel 1006 and the active gate region 1003 that will deplete the channel 1006 to reduce the conductivity between the drain wire 1008 and the source wire 1010. The active gate region 1003 is so termed herein because only the several nanometers of what corresponds to the lower field plate 434 of FIG. 4A, most distal from the contact 430 from which the field plate 434 extends, influence the depletion of the channel 1006.

Figure 11:
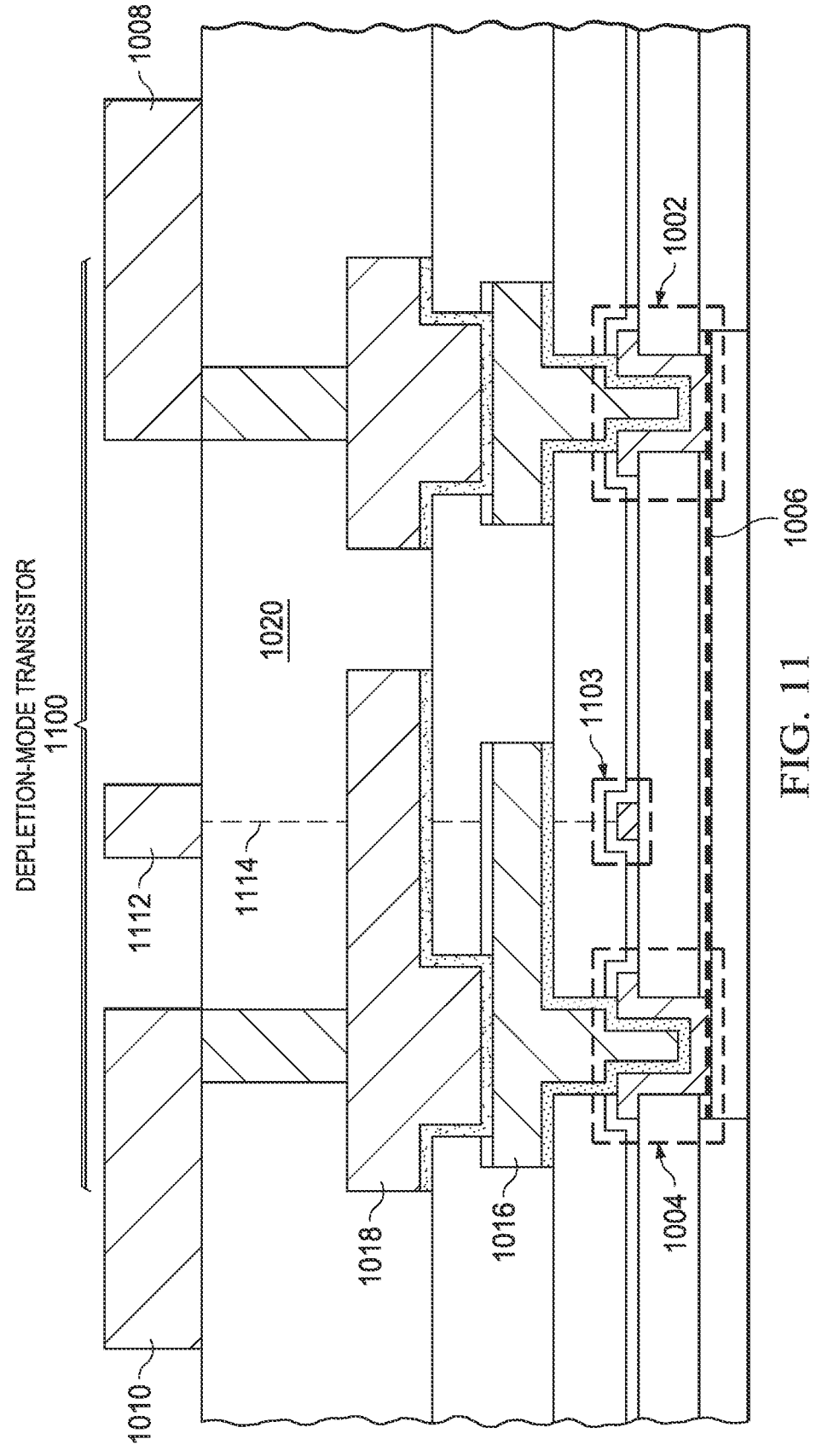
FIGS. 11-15 are cross-sectional views of different example depletion-mode transistors.

FIG. 11 shows an example depletion-mode transistor 1100 fabricated similarly to depletion-mode current source 1000 but which provides a three-terminal device by fabricating what corresponds to the lower field plate 434 of FIG. 4A discontinuously as two separate electrodes 1103, 1004. Wiring 1008, 1010, 1112 is fabricated to conductively couple the three terminals—drain, source, and gate, respectively—of depletion-mode transistor 1100. Upper dielectric layer 1020 can be opened to provide the respective conductive coupling of the drain, gate, and source regions 1002, 1103, 1004 to the wires 1008, 1112, 1010. Drain region 1002 is conductively coupled to drain wire 1008. Source region 1004 is conductively coupled to source wire 1010. Active gate region 1103 has an influence on the channel 1006 below. The active gate region 1103 is conductively coupled to gate wire 1112, which is positioned (e.g., along dotted line 1114, but behind or in front of the plane of the cross-section shown in FIG. 11) so as not to physically intersect in three-dimensional space with field plates 1016, 1018 above the active gate region 1103. The drain region 1002 and the source region 1004 are electrically coupled to each other via the 2DEG channel 1006, which, as noted above, can be a 2DHG channel in some examples. In the depletion-mode transistor 1100, as compared to the depletion-mode current source 1000, the source degeneration resistance is reduced to near zero (by, for example, reducing the length 1005 of the resistively patterned portion 512 of the 2DEG channel to near zero), and the gate contact is separated from the source contact. In some examples, the depletion-mode transistor 1100 can be fabricated similarly to the enhancement-mode GaN transistor 402 of FIG. 4A, except that the depletion-mode transistor 1100 does not include p-doped GaN 444 in the gate stack, resulting in a negative threshold voltage and hence the characteristics of a depletion-mode transistor. Depletion-mode transistor 1100 can thus be formed without introducing additional masks or process steps to the enhancement-mode GaN process.

The potential at the gate wire 1112 can control the resistivity of the depletion-mode transistor 1100 between the drain wire 1008 and the source wire 1010 by adjusting the extent to which the active gate region 1103 depletes the channel 1006. The distance between the channel 1006 and the gate electrode in the active gate region 1103 defines the minimum negative voltage required to fully deplete the underlying channel 1006.

Figure 13:
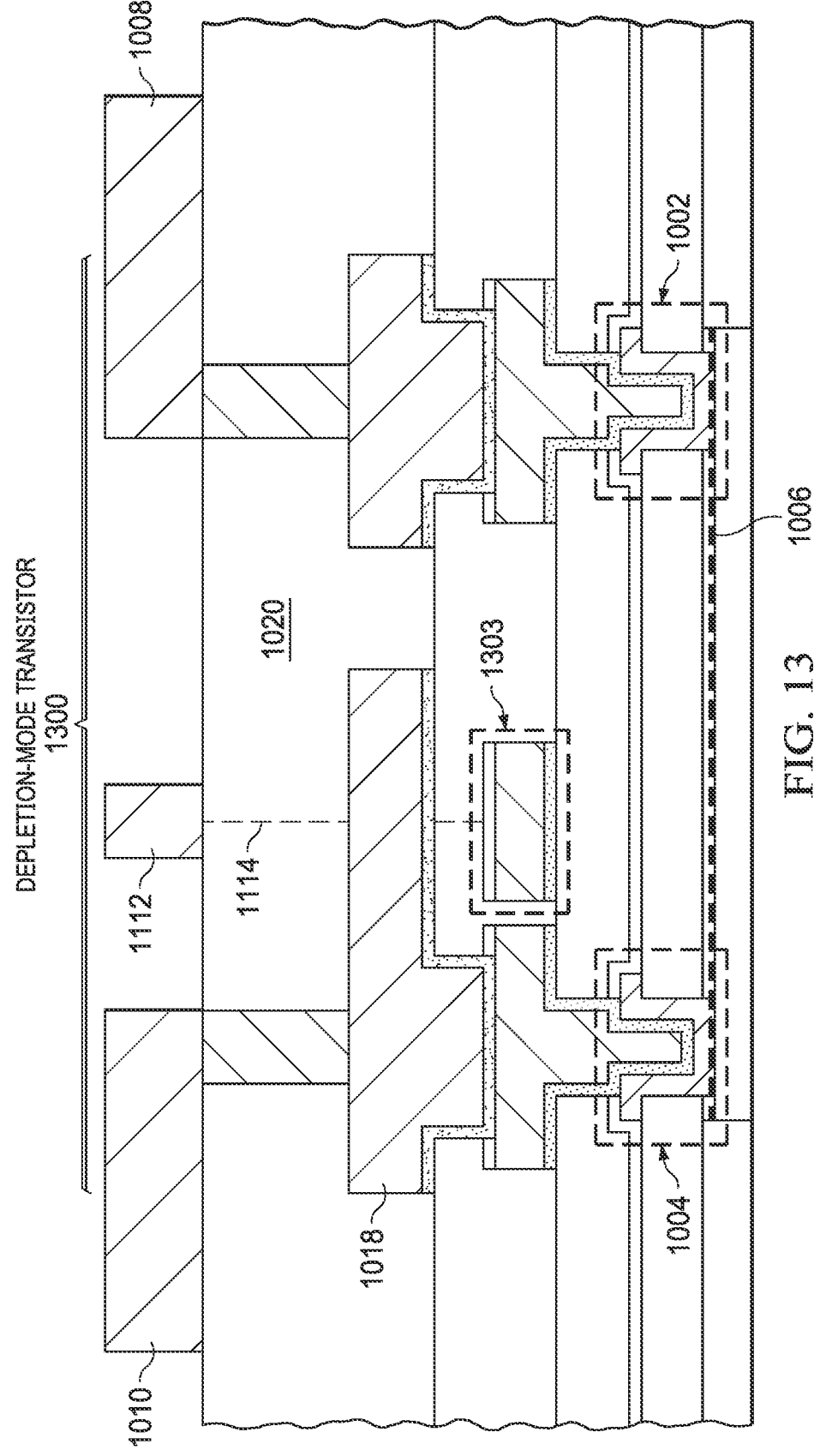
Figure 14:
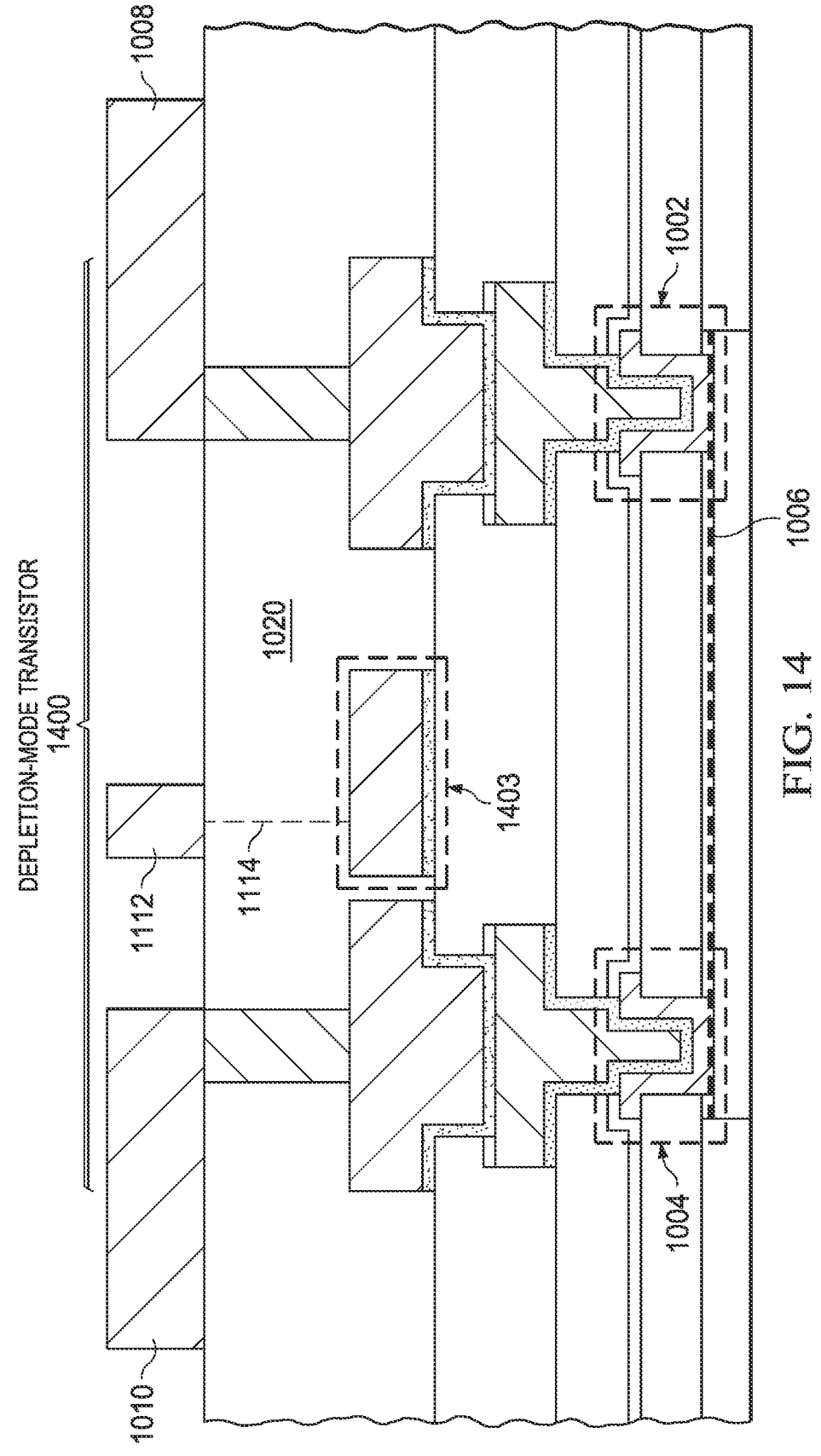

In the examples described above, any of the following layers, used in the enhancement-mode process flow that can be used to fabricate enhancement-mode FET 402, capacitor 412, resistor 418, and depletion-mode current source 426 or 1000 and/or depletion-mode transistor 1100, can be configured as a separate gate electrode of a depletion-mode transistor: first contact metal layer 456, gate metal layer 464, second contact metal layer 476, and fourth contact metal layer 496. In the example depletion-mode transistor 1100 of FIG. 11, it is the first contact metal layer 456 that is configured as the gate electrode 1103. FIG. 12 shows another example depletion-mode transistor 1200 in which gate metal layer 464 is the layer configured as the gate electrode 1203. FIG. 13 shows yet another example depletion-mode transistor 1300 in which second contact metal layer 476 is the layer configured as the gate electrode 1303. FIG. 14 shows still another example depletion-mode transistor 1400 in which fourth contact metal layer 496 is the layer configured as the gate electrode 1403.

In the example depletion-mode transistor 1100 of FIG. 11, the first contact metal layer 456 can be formed without a prior step etching through the first dielectric layer 454 in the relevant region of the depletion-mode transistor gate, resulting in a depletion-mode transistor gate with a threshold voltage of between about −2 V and about −3 V, corresponding to the measurement curve 608 in FIG. 6. In the example of FIG. 11, the channel 1006 is depleted when the potential difference between the gate electrode 1103 and the underlying portion of the channel 1006 is at or lower than this threshold voltage of between about −2 V and about −3 V.

In the example depletion-mode transistor 1200 of FIG. 12, gate metal layer 464, which can be used to form the gate of the enhancement-mode FET 402, can be formed as separate gate electrode 1203 on top of second dielectric layer 460. Resultantly, this depletion-mode transistor gate electrode 1203 has a slightly larger distance to the 2DEG channel 1006 than does the gate electrode 1103 of the transistor 1100, leading to a larger negative threshold voltage of between about −4 V and about −5 V, corresponding to the measurement curve 606 in FIG. 6. In the example of FIG. 12, the channel 1006 is depleted when the potential difference between the gate electrode 1203 and the underlying portion of the channel 1006 is at or lower than this threshold voltage of between about −4 V and about −5 V. Gate electrode 1203 may be conductively coupled to wire 1112, and the depletion-mode transistor 1200 can otherwise function as described above with respect to depletion-mode transistor 1100.

The second contact metal layer 476 and the fourth contact metal layer 496 can be used for electrical interconnections between devices on the semiconductor chip, but can also be configured as field plates 436, 438, respectively, in depletion-mode current source 426 or 1000, or in depletion-mode transistors 1300 and 1400 of FIGS. 13 and 14 as separate gate electrodes 1303 and 1403, respectively. In the example depletion-mode transistor 1300 of FIG. 13, second contact metal layer 476 can be formed as separate gate electrode 1303 on top of third dielectric layer 468. Resultantly, depletion-mode transistor gate electrode 1303 has a still larger distance to the 2DEG channel 1006 than does the gate electrode 1203 of transistor 1200, leading to a still larger negative threshold voltage of between about −15 V and about −40 V. In the example depletion-mode transistor 1400 of FIG. 14, fourth contact metal layer 496 can be formed as separate gate electrode 1403 on top of fifth dielectric layer 490. Resultantly, depletion-mode transistor gate electrode 1403 has a still larger distance to the 2DEG channel than does the gate electrode 1303 of the transistor 1300, leading to a still larger negative threshold voltage of between about −200 V and about −300 V.

Although not exhaustively illustrated, other examples can be based on each of the example depletion-mode transistors 1100, 1200, 1300, and 1400 of FIGS. 11, 12, 13, and 14, in which one or more overlying field plates 1016, 1018 is fabricated as a separate gate electrode, or in which additional metal layers can be included to provide more and/or higher field plates or separate gate electrodes to enable even higher voltage applications. In some examples (not illustrated), additional conductive (e.g., metal) layers above the fourth contact metal layer 496 can be provided as additional, higher field plates to enable higher voltage applications, e.g., operating in the range of between about 900 V and about 1200 V, or at about 2000 V.

Figure 15:
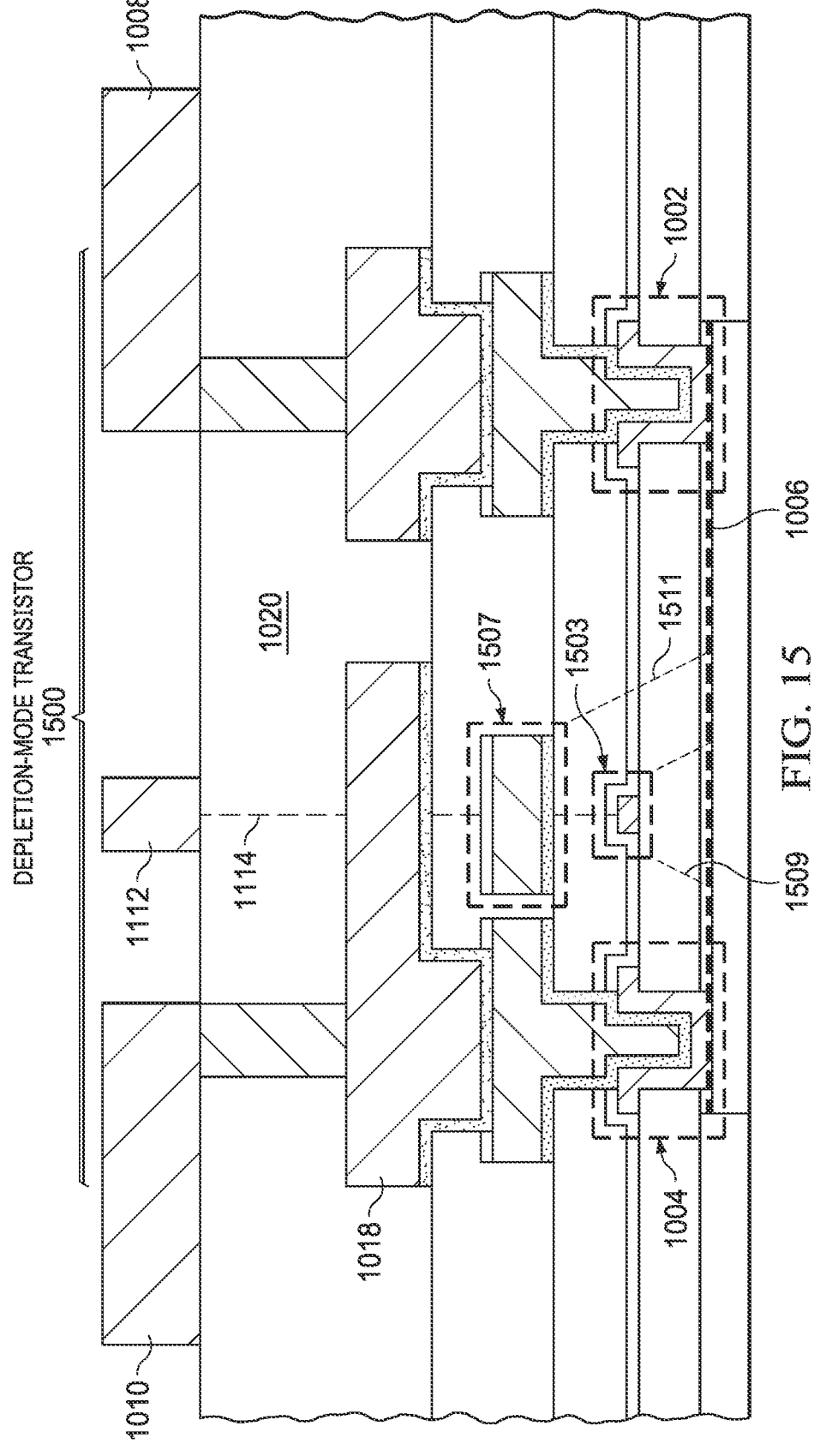

As just one example of separate electrodes being formed on multiple layers, FIG. 15 shows a depletion-mode transistor 1500 in which both the lower and middle field plates 434, 436 have been fabricated as separate gate electrodes 1503, 1507. In any such example, the electrode acting as a gate is the lowest electrode present (electrode 1503 in the example of FIG. 15), since it has the smallest distance to the 2DEG channel 1006 and thus shows the lowest threshold voltage (the threshold voltage closest to 0 V). In the operation of depletion-mode transistor 1500, gate electrode 1503, fabricated using the first contact metal layer 456, depletes the 2DEG channel 1006 when its gate voltage is between about −2 V and about −3 V, whereas gate electrode 1507, fabricated using the second contact metal layer 476, depletes the 2DEG channel 1006 when its gate voltage is between about −40 V and about −50 V. In the latter case, the transistor channel 1006 connecting drain 1002 and source 1004 is already open (non-conductive), because gate electrode 1503 has already depleted the 2DEG channel 1006. However, at or beyond (less than) the larger negative threshold voltage of gate electrode 1507, gate electrode 1507 depletes the 2DEG channel 1006 further away from the gate edge facing the drain 1002, as indicated by broken line 1511 as compared to broken line 1509, which reduces the electric field at this gate edge and consequently enhances the maximum drain-source/drain-gate voltage capability of the depletion-mode transistor 1500, consistent with the functioning of the field plates 436, 438 of depletion-mode current source 426 in FIG. 4A and as described above with respect to FIG. 6. For such an effect to be observed, it is substantially immaterial whether the second contact metal layer 476 is configured as a separate gate electrode 1507, as shown in FIG. 15, or as a field plate connected to the source 1004 of the transistor 1500, as long as it is a low voltage potential compared to the drain 1002 of the transistor 1500. In examples like that of FIG. 15 having separate gate electrodes on multiple layers, only the lowest conductive (e.g., metal) layer functions as a transistor gate, and all conductive layers above it act as field plates as long as they are conductively coupled to a low-voltage potential, e.g., to the gate wire 1112, or the source wire 1010, or to another potential which is substantially smaller than the potential of the drain 1002.

Thus, for example, if a depletion-mode transistor according to the above examples having a threshold voltage of about −5 V is desired, the depletion-mode transistor gate can be fabricated using gate metal layer 464, omitting any field plate or gate electrode fabricated using first contact metal layer 456, as shown in FIG. 12, for the gate—channel distance to result in the desired threshold voltage. Failing to omit first contact metal layer 456 in such a depletion-mode transistor would lead to a lower threshold voltage of between about −2 V and about −3 V. Similarly, if a depletion-mode transistor according to the above examples having a threshold voltage of about −40 V is desired, the depletion-mode transistor gate can be fabricated using second contact metal layer 476, omitting any field plate or gate electrode fabricated using first contact metal layer 456 or gate metal layer 464, as shown in FIG. 13, for the gate—channel distance to result in the desired threshold voltage.

A depletion-mode transistor consistent with any of the above examples 1100, 1200, 1300, 1400, 1500, or extensions thereof can be fabricated with a method substantially similar to that described above with regard to the flow chart of FIG. 9, by incorporating the conductive electrode separation and channel resistive patterning reduction (e.g., to near zero) distinctions described above. A depletion-mode transistor consistent with any of the above examples 1100, 1200, 1300, 1400, 1500, or extensions thereof can be used as current source 108 in FIG. 1, in the start-up circuit 208 in FIG. 2, or in the pre-charge circuit 302 in FIG. 3A. Where a three-terminal depletion-mode transistor is used as a two-terminal device, such as the pre-charge circuit 302 of FIG. 3A, the three-terminal depletion-mode transistor can be effectively made into a two-terminal current source by, for example, conductively coupling the gate of the depletion-mode transistor to the source of the depletion-mode transistor by wiring on a wiring layer. For example, in the depletion-mode transistor 1100 of FIG. 11, a two-terminal device can be made by joining gate wire 1112 with source wire 1010.

A depletion-mode current source or transistor as described herein, including electrodes (e.g., metal field plates) to deplete an underlying 2DEG or 2DHG channel, can be fabricated in an enhancement-mode-only process without additional masks beyond those used to fabricate the enhancement-mode transistor. The depletion-mode current source or transistor as described herein thus allows a robust start-up circuit to be implemented, on a single IC, in an enhancement-mode-only GaN fabrication process, without requiring a separately fabricated depletion-mode transistor (e.g., fabricated on a different IC) to achieve the same functionality, and without necessitating additional masks in the enhancement-mode fabrication process flow. Processing costs are thereby kept low. No high-quality well-controlled insulator is required to achieve a depletion-mode current-source characteristic. Lower metal field plating in the current source leads to lower saturation current and threshold voltage $V_{th}$ of the current source. Multiple field plates can be used to achieve higher voltage capability. The start-up circuit can thereby be made capable of operating, without breakdown, at high voltages greater than about 400 V, e.g., greater than about 650 V, e.g., greater than about 1,000 V.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. A semiconductor device, comprising:

A two-terminal depletion-mode current source including:
    A first semiconductor layer having a channel with a two-dimensional electron gas (2DEG) or a two-dimensional hole gas (2DHG),
    A first terminal of the depletion-mode current source and a second terminal of the depletion-mode current source, the second terminal being laterally spaced apart from the first terminal, wherein the first and second terminals are conductively coupled to the 2DEG or 2DHG of the channel in a vertical direction;
    A second semiconductor layer disposed on the first semiconductor layer;
    A dielectric layer disposed on the second semiconductor layer, the dielectric layer extending between the first and second terminals; and
    A conductive electrode disposed on the dielectric layer, the conductive electrode coupled to and extending from the first terminal and extending over at least a portion of the channel, wherein an entire space between the second semiconductor layer and the conductive electrode includes a dielectric material of the dielectric layer only.

2. The semiconductor device of claim 1, wherein the conductive electrode extends to a point over the channel, and wherein a first distance along the channel between the point and the first terminal is greater than a second distance along the channel between the point and the second terminal.

3. The semiconductor device of claim 1, wherein a lower surface of the conductive electrode is between 1,500 angstroms and 1,700 angstroms above the channel.

4. The semiconductor device of claim 1, wherein the conductive electrode is a lower conductive electrode, the depletion-mode current source further comprising a second conductive electrode above and extending over the lower conductive electrode.

5. The semiconductor device of claim 4, wherein the second conductive electrode is a middle conductive electrode, the depletion-mode current source further comprising a third conductive electrode above and extending over the middle conductive electrode.

6. The semiconductor device of claim 5, wherein
the third conductive electrode is an upper conductive electrode,
a lower surface of the lower conductive electrode is between 1,500 angstroms and 1,700 angstroms above the channel,
a lower surface of the middle conductive electrode is between 3,900 angstroms and 4,200 angstroms above the channel, and
a lower surface of the upper conductive electrode is between 9 kiloangstroms and 10 kiloangstroms above the channel.

7. The semiconductor device of claim 1, further comprising an enhancement-mode field-effect transistor (e-mode FET), wherein:
the second terminal of the depletion-mode current source is connected to a drain of the e-mode FET; and
the first terminal of the depletion-mode current source is connected to a gate of the e-mode FET.

8. The semiconductor device of claim 7, wherein the e-mode FET includes a p-type-doped gallium nitride (p-GaN) layer.

9. The semiconductor device of claim 7, wherein the depletion-mode current source is further coupled to a metal-insulator-metal (MIM) capacitor of the semiconductor device, wherein the first terminal of the depletion-mode current source is connected to a first plate of the MIM capacitor.

10. The semiconductor device of claim 1, wherein:
the first semiconductor layer corresponds to a gallium nitride (GaN) semiconductor layer; and
the second semiconductor layer corresponds to an aluminum gallium nitride (AlGaN) semiconductor layer.

11. The semiconductor device of claim 1, wherein the conductive electrode comprises a multi-layer including:
a lower layer of titanium (Ti) having a thickness of between 300 angstroms and 500 angstroms;
a middle layer of aluminum-copper (AlCu) over the lower layer of Ti, the middle layer of AlCu having a thickness of between 750 angstroms and 1,250 angstroms; and
an upper layer of titanium nitride (TiN) over the middle layer of AlCu, the upper layer of TiN having a thickness of between 400 angstroms and 600 angstroms.

12. The semiconductor device of claim 1, further comprising:
an enhancement-mode field-effect transistor (enhancement-mode FET);
a resistor; and
a metal-insulator-metal (MIM) capacitor, wherein the enhancement-mode FET and the resistor include the first and second semiconductor layers to support respective channels having 2DEG or 2DHG between a first terminal and a second terminal of the resistor, between a drain and a gate of the enhancement-mode FET, and between the gate and a source of the enhancement-mode FET, respectively.

13. An integrated circuit (IC) comprising:
a first enhancement-mode gallium nitride (GaN) field effect transistor (e-mode GaN FET);
a resistor including a first portion of a semiconductor-semiconductor forming a resistor channel having two-dimensional electron gas (2DEG) or a two-dimensional hole gas (2DHG);
a metal-insulator-metal (MIM) capacitor; end;
a depletion-mode current source including:
    a positive terminal and a negative terminal;
    a channel having a second portion of the semiconductor-semiconductor interface in a patterned area, the channel having 2DEG or 2DHG; and
    a metal field plate coupled to the negative terminal, the metal field plate extending over a portion of the patterned area, wherein:
    the positive terminal is directly connected to a drain of the first e-mode GaN FET;
    the negative terminal is connected to a gate of the first e-mode GaN FET and to a positive terminal of the MIM capacitor; and
    a source of the first e-mode GaN FET is connected to a first terminal of the resistor; and
a second e-mode GaN FET Including:
    a drain coupled to the gate of the first e-mode GaN FET, to the negative terminal of the depletion-mode current source, and to the positive terminal of the MIM capacitor;
    a gate coupled to the source of the first e-mode GaN FET and to the first terminal of the resistor; and a source coupled to a negative terminal of the MIM capacitor and to a second terminal of the resistor.

14. The IC of claim 13, wherein the depletion-mode current source has a saturation current of between 100 nA and 10 μA at voltages across the depletion-mode current source of greater than 10 V.

15. The IC of claim 13, wherein the metal field plate of the depletion-mode current source is between 1,500 angstroms and 1,700 angstroms above the channel of the depletion-mode current source.

16. A semiconductor device, comprising:

A depletion-mode current source including:

A first semiconductor layer having a channel with a two-dimensional electron gas (2DEG) or a two-dimensional hole gas (2DHG), A positive terminal and a negative terminal, wherein:

The positive and negative terminals are laterally spaced apart from each other, and The positive and negative terminals are conductively coupled to the 2DEG or 2DHG of the channel in a vertical direction;

A second semiconductor layer disposed on the first semiconductor layer;

A dielectric layer disposed on the second semiconductor layer, the dielectric layer extending between the positive and negative terminals;

A first conductive electrode disposed on the dielectric layer, the first conductive electrode coupled to and extending from the negative terminal and extending over at least a portion of the channel, wherein an entire space between the second semiconductor layer and the first conductive electrode includes a dielectric material of the dielectric layer only; and A second conductive electrode disposed on the dielectric layer, the second conductive electrode being separate from the first conductive electrode and disposed between the first conductive electrode and the positive terminal of the depletion-mode current source.

17. The semiconductor device of claim 16, further comprising:

an enhancement-mode gallium nitride (GaN) field effect transistor (e-mode GaN FET);

a resistor; and a metal-insulator-metal (MIM) capacitor, wherein the positive terminal of the depletion-mode current source is directly connected to a drain of the e-mode GaN FET;

the negative terminal of the depletion-mode current source is connected to a gate of the e-mode GaN FET and to a positive terminal of the MIM capacitor; and a source of the e-mode GaN FET is connected to a positive terminal of the resistor.

18. The semiconductor device of claim 17, wherein the e-mode GaN FET is a first GaN FET, and the semiconductor device further comprises a second GaN FET comprising:

a drain coupled to the gate of the first GaN FET, to the negative terminal of the depletion-mode current source, and to the positive terminal of the MIM capacitor;

a gate coupled to the source of the first GaN FET and to the positive terminal of the resistor; and a source coupled to a negative terminal of the MIM capacitor and to a negative terminal of the resistor.

* * * * *